United States Patent
Kato et al.

(10) Patent No.: US 6,947,514 B1
(45) Date of Patent: Sep. 20, 2005

(54) PHASE-LOCKED LOOP CIRCUIT, INFORMATION PROCESSING APPARATUS, AND INFORMATION PROCESSING SYSTEM

(75) Inventors: Kazuo Kato, Naka-Gun (JP); Takashi Sase, Hitachi (JP); Takashi Hotta, Hitachi (JP); Hirokazu Aoki, Hachioji (JP); Kozaburo Kurita, Ome (JP)

(73) Assignee: Renesas Technology Corporation, Tokyo (JP)

(*) Notice: Subject to any disclaimer, the term of this patent is extended or adjusted under 35 U.S.C. 154(b) by 0 days.

(21) Appl. No.: 09/446,507

(22) PCT Filed: Jun. 26, 1998

(86) PCT No.: PCT/JP98/02870

§ 371 (c)(1),
(2), (4) Date: Dec. 27, 1999

(87) PCT Pub. No.: WO99/00903

PCT Pub. Date: Jan. 7, 1999

(30) Foreign Application Priority Data

Jun. 27, 1997 (JP) ............................... 09-171470
Sep. 12, 1997 (JP) ............................... 09-248701

(51) Int. Cl.[7] .............................. H03D 3/24; H03L 7/06
(52) U.S. Cl. ...................................... 375/376; 327/156
(58) Field of Search ................................ 375/373, 374, 375/375, 376, 354, 356, 371; 327/100–104, 327/141, 146, 148, 155, 156, 157, 147, 144

(56) References Cited

U.S. PATENT DOCUMENTS

| | | | | |
|---|---|---|---|---|
| 5,036,294 A | * | 7/1991 | McCaslin | 331/1 A |
| 5,168,245 A | * | 12/1992 | Koskowich | 331/1 A |
| 5,180,214 A | * | 1/1993 | Yeh et al. | 303/168 |
| 5,362,990 A | * | 11/1994 | Alvarez et al. | 327/538 |
| 5,414,390 A | * | 5/1995 | Kovacs et al. | 331/2 |
| 5,422,911 A | * | 6/1995 | Barrett et al. | 375/327 |
| 5,475,718 A | * | 12/1995 | Rosenkranz | 375/376 |
| 5,512,860 A | * | 4/1996 | Huscroft et al. | 331/1 A |
| 5,552,733 A | * | 9/1996 | Lesmeister | 327/295 |
| 5,566,204 A | * | 10/1996 | Kardontchik et al. | 375/219 |
| 5,577,073 A | * | 11/1996 | White | 375/324 |
| 5,710,526 A | * | 1/1998 | Nauta et al. | 331/25 |
| 5,783,956 A | * | 7/1998 | Ooishi | 327/157 |
| 5,825,640 A | * | 10/1998 | Quigley et al. | 363/60 |
| 5,909,474 A | * | 6/1999 | Yoshizawa | 375/376 |
| 5,936,445 A | * | 8/1999 | Babanezhad et al. | 327/157 |
| 5,999,039 A | * | 12/1999 | Holst et al. | 327/532 |

(Continued)

FOREIGN PATENT DOCUMENTS

JP    63-194419    8/1988

(Continued)

*Primary Examiner*—Tesfaldet Bocure
(74) *Attorney, Agent, or Firm*—Antonelli, Terry, Stout & Kraus, LLP

(57) ABSTRACT

A phase locked loop (PLL) circuit is provided to operate in a broad band, including two separate loops one of which is for feed-back of an output from an oscillator to the same oscillator through its associative proportional control unit and the other of which is for feed-back of an output of an oscillator to the same oscillator via an integral control unit. The proportional control unit is arranged to control an output frequency of the oscillator and is operable to generate a control signal based on a difference between input and output signals. The integral control unit is arranged to control the phase of an output signal of the oscillator to thereby generate a control signal based on a phase difference between input and output signals.

20 Claims, 22 Drawing Sheets

U.S. PATENT DOCUMENTS 6,163,186 A * 12/2000 Kurita .................. 327/157
6,177,821 B1 * 1/2001 Morikawa ............. 327/160
6,229,861 B1 * 5/2001 Young .................. 375/356
6,424,230 B1 * 7/2002 Kocaman et al. ....... 331/15

FOREIGN PATENT DOCUMENTS

| | | |
|---|---|---|
| JP | 2-154521 | 6/1990 |
| JP | 3-212022 | 9/1991 |
| JP | 3-235425 | 10/1991 |
| JP | 6-112820 | 4/1994 |
| JP | 6-202763 | 7/1994 |
| JP | 6-303133 | 10/1994 |
| JP | 8-139597 | 5/1996 |

* cited by examiner

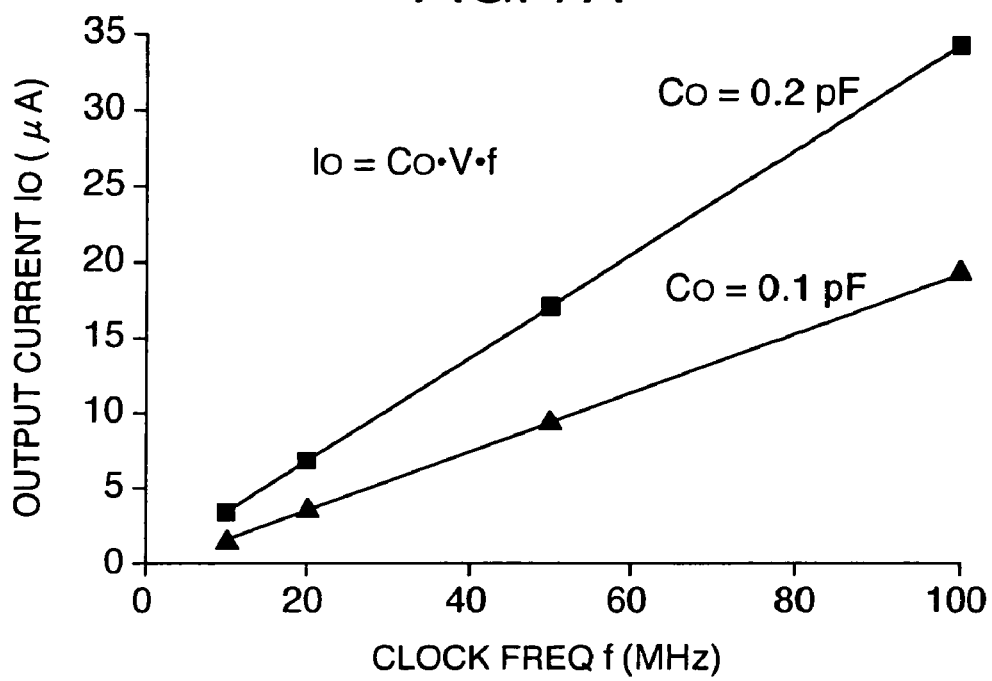
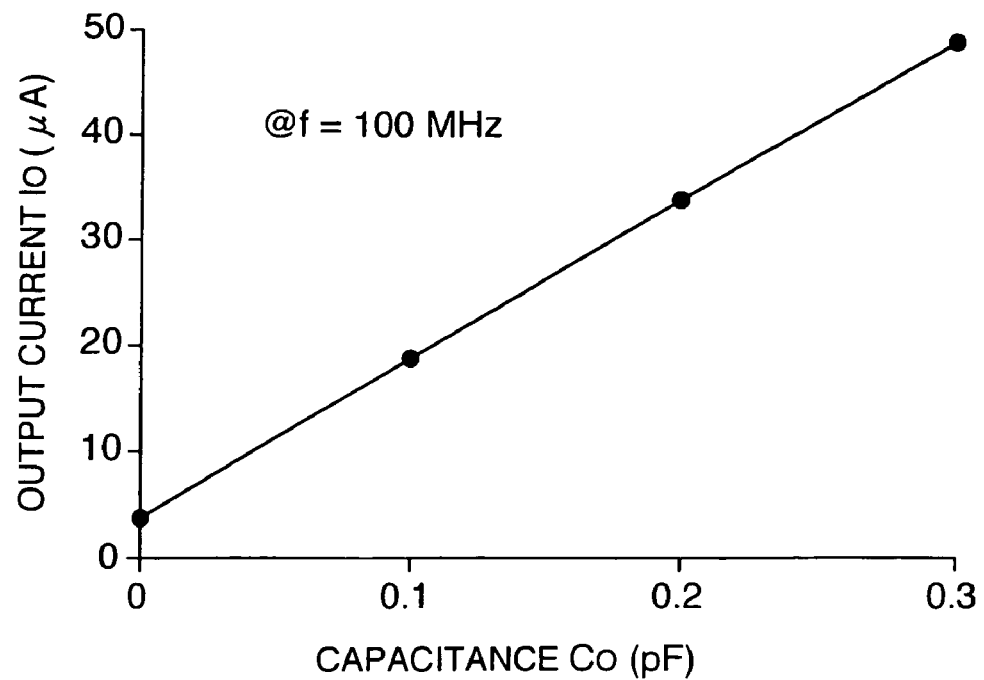

US 6,947,514 B1

PHASE-LOCKED LOOP CIRCUIT, INFORMATION PROCESSING APPARATUS, AND INFORMATION PROCESSING SYSTEM

TECHNICAL FIELD

The present invention relates generally to phase-locked loop (PLL) circuitry with linearization controllability of controlled oscillator (VCO/CCO) devices and information processing systems employing the same, for providing a technique adaptable for use in built-in clock signal generation circuits integrated in microprocessors. This invention also relates to current switch circuitry; more particularly but not exclusively, the invention relates to current switch circuits suitable for use as certain circuits requiring high-speed analog switches including phase-locked loop (PLL) circuits, analog-to-digital (A/D) converter circuits or digital-to-analog (D/A) converter circuits.

BACKGROUND ART

In recent years, phase-locked loop circuits (referred to as "PLL circuits" hereinafter) have been often employed as the built-in clock generator means of microprocessors while the operating frequencies thereof have also increased to offer widened ranges in accordance with the application of such microprocessors.

To enable the PLL circuits to operate in wide regions in this way, use of some bias-generation/control means proportional to the operation frequency is inevitable. Several techniques for achieving this have been disclosed until today.

One example is found in JP-A-4-37219, which discloses therein a technique for attaining a stabilized operation by applying a bias control including the steps of detecting a loop filter voltage and then controlling it at Vcc/2 in any events in view of the fact that at a point whereat an operating frequency was moved out of a preset value a loop filter output voltage can also move in PLL circuits. Another example is taught by JP-A-2-230821 or by JP-A-8-139597, which disclose therein a method of making use of a replica circuit having the same delay characteristics as a current-controlled oscillator (CCO) to set up an operating point of such CCO in PLL circuitry, which method is used to perform setting of the CCO's operating point in a way proportional to an input operating frequency to thereby accomplish the intended operability with increased stability.

However, the prior known approaches above are such that circuitry is designed and controlled under a mere assumption that CCO must be linear in its input/output characteristics which are requisite conditions or criteria for enabling a PLL circuit to operate in a wide range. Unfortunately the input/output characteristics of CCOs in high-frequency regions are non-linear characteristics—in this case, a setup point of the center frequency and/or CCO control gain will likewise become nonlinear so that letting it operate in a wide range can result in major parameters of a PLL control system behaving to go out of the optimal design value, which in turn makes impossible or at least greatly difficult to achieve any stable or stabilized operations. Accordingly, the prior art approaches are encountered with a problem that in order to provide stabilized operability, the CCO must be designed to operate only within a limited low frequency side with good linearity.

While currently available PLL circuits are typically for use in controlling an oscillator in accordance with a phase difference between an input signal and an oscillation signal of the oscillator, achievement of this control requires that a difference in frequency between the input signal and oscillation signal stay within a specified range; otherwise, the PLL circuit will no longer offer its intended functions. In short, prior art PLL circuits suffer from the limited applicability—namely, these may offer expected operability only within a narrow range of a limited frequency difference between the input and oscillation signals.

On the other hand, as the LSI technologies in this field are becoming more advanced every year in per-chip component miniaturization and voltage reduction plus frequency increase, the saturation of CCO characteristics and other nonlinearities are likewise increasing year by year, which in turn makes it extremely difficult to meet the system designer's needs for enhancing operabilities of PLL circuits covering extended ranges.

It should also be noted that prior art circuitry that requires high-speed analog switches, including but not limited to PLL circuits and analog-to-digital (A/D) converter circuits as well as digital-to-analog (D/A) converter circuits or else, is designed to employ a cascode switch circuit and/or a current switch circuit having a level-shift driver stage of low impedance. One exemplary configuration of the current switch circuit with such level-shift drive stage has been set forth in J. Grame, "Monolithic D/A Improves Conversion Time," EDN Magazine, Mar. 15, 1971 at pp. 39–41.

Incidentally the cascode switch circuit above is incapable of sufficiently shortening the turn-on/off time period because of its time constant occurring due to a parasitic capacitance in switch-off events. This makes it impossible to sufficiently speed up the switching operations.

A problem associated with the current switch circuit with the level-shift drive stage is that this circuit is complicated in configuration of such level-shift drive stage (an increase in number of series-connected components therein) and thus can easily be influenced by unevenness of components. Due to this, the level-shift drive stage must be constituted from an emitter-follower thereby letting this drive stage perform high-voltage operations. Accordingly the current switch circuit with level-shift drive stage is not suitable for use in achieving voltage reduction of LSIs. If an attempt is made to force it to operate at low voltages, then the resulting drive impedance in a direction in which an emitter current decreases relative to a switching signal would become higher than the drive impedance in the opposite direction in which such current increases, thereby causing resultant switching time to increase nonsymmetrically. For this reason, it remains impossible to achieve the intended switching operations at high speeds.

DISCLOSURE OF INVENTION

The present invention has been made in view of the foregoing problems, and its primary object is to realize a PLL circuit capable of operating in a widened range while retaining optimal control loop parameters by removing any possible deviation in center frequency settings based on CCO's nonlinearity and/or instability factors for loop control gains. This may be attained by letting it have a first feed-back circuit for use in generating and issuing a second clock signal that is synchronized in phase with a first clock signal as input thereto, and a second feedback circuit for generation of the second clock signal that is substantially equal in frequency to said first clock signal being presently input.

This is also attainable by having a first control signal generation unit responsive to receipt of an input signal for generating a first control signal used for integral integration of an output signal, a second control signal generation unit for generating based on the input signal a second control signal for integral integration of the output signal, and an oscillator responsive to the first and second control signals for outputting a clock signal.

In short, even where any intended synchronization cannot be taken between an input frequency and output frequency due to presence of a phase difference, a difference in frequency between the input and output frequencies may be removed through proportional control thereby enabling achievement of in-phase synchronization or phase-lock, which in turn makes it possible to achieve well stabilized operations in a broad band.

In addition, a second object of the present invention is to provide a converter for use in performing loop control with further increased accuracy. This is achievable by employing for a proportional control unit a specific converter circuit comprised of a charging/discharging circuit, which includes a CMOS inverter for performing charging and discharging operations on the basis of a signal as input thereto and a capacitor operatively associated therewith, and a current mirror filter to thereby offer an ability to significantly enhance the linearity of input/output characteristics, which may result in achievement of the high-accuracy control required.

A third object of the instant invention is to provide a microcomputer that employs a wide-range operable PLL circuit and is capable of operating at an optimal clock frequency in a way pursuant to operation environments. This is attainable by providing a specific information processing system configured including an information processing device for performing data processing based on a clock frequency and circuitry connected to the information processing device for outputting an internal state, wherein the information processing device is such that letting the clock frequency be variable on the basis of the internal state as output from the peripheral circuit makes it possible to provide a system that executes the optimal operation in accordance with environments.

A fourth object of this invention is to provide a current switch circuit capable of shortening a switching time period in both switch-on and -off directions. Another object of the invention is to provide a current switch circuit capable of offering low-voltage operabilities. This is attainable by letting the current switch comprise a current switch with its control electrode forward-biased and also a voltage switch of a complementary output for driving said current switch with its output connected to the low voltage-side electrode of said current switch.

Here, the current switch may be configured from one of several semiconductor switch devices such as for example MOS transistors, bipolar transistors, IGBTs and others. This current switch may alternatively be arranged to constitute a constant current circuit.

Additionally the complementary output voltage switch may be a CMOS inverter, bipolar complementary emitter-follower or else.

In the present invention, upon application of a control signal of "Open" direction to the voltage switch's input node, an output of this voltage switch causes a presently forward-biased voltage at the low voltage-side electrode of the current switch to change in potential thus letting the current switch turn off. Whereby the current switch rapidly turns off.

On the other hand, when a control signal of "Close" direction is applied to the input of the voltage switch, the voltage switch derives an output which causes it to change in the direction that the current switch's low voltage-side electrode voltage is rendered conductive. Whereby the current switch rapidly turns on.

It should be noted here that with the present invention, a voltage switch of complementary output characteristics is used as the current switch's drive stage. As this voltage switch of complementary output characteristics becomes low in output impedance with respect to both of the high and low output levels, it is possible to sufficiently shorten the switching time in both the switch-on and -off directions.

Furthermore, as the current switch drive stage is comprised of the voltage switch having the complementary output characteristics, it is possible to reduce or minimize the requisite number of series-connected circuit components in the drive stage. This in turn makes it possible to achieve enhanced operability with low voltages.

BRIEF DESCRIPTION OF DRAWINGS

FIGS. 7A and 7B are diagrams each showing input/output characteristics of the F/I converter shown in FIG. 6.

BEST MODE FOR CARRYING OUT THE INVENTION

Figure 1:
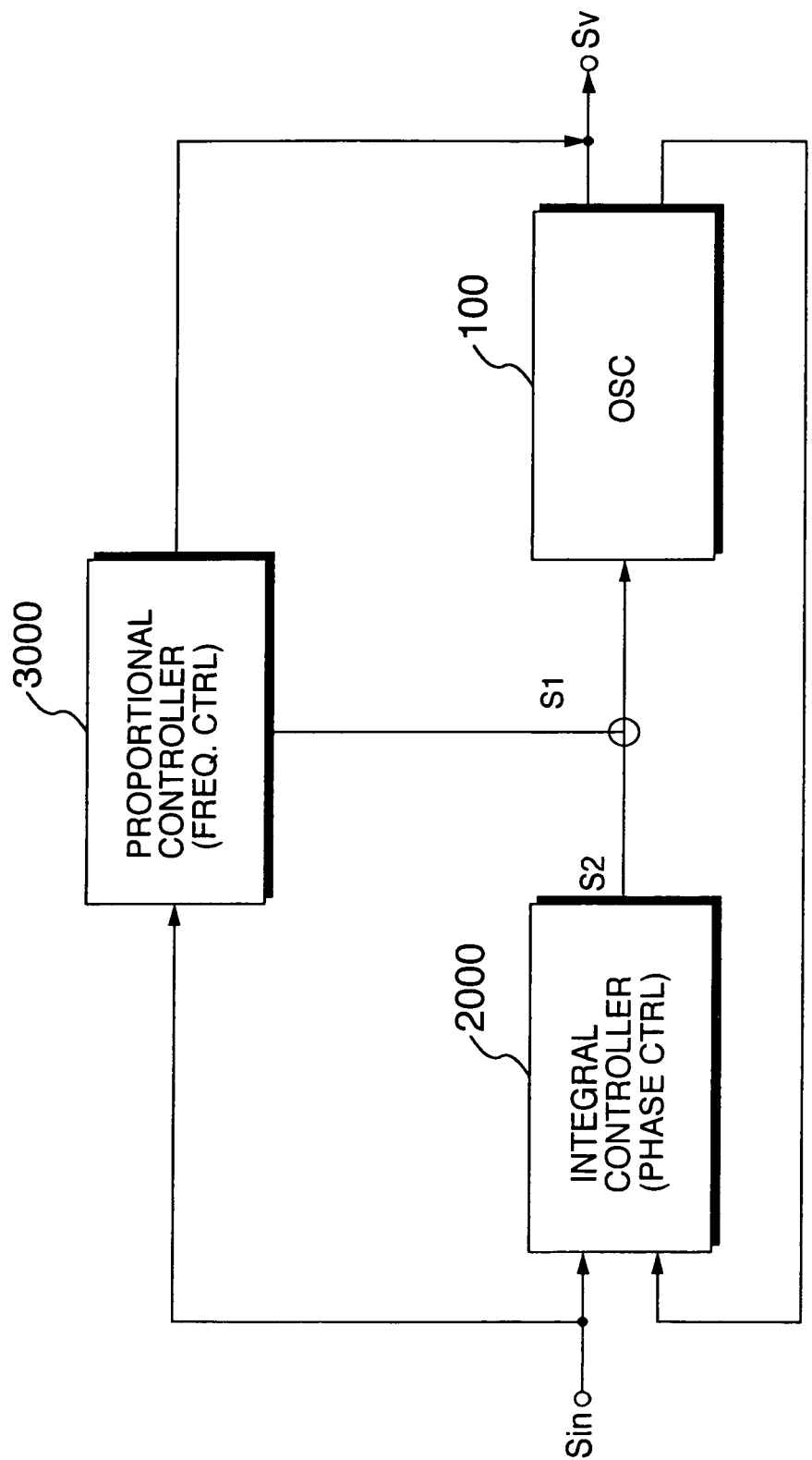
FIG. 1 is a diagram showing a basic configuration of a broad band PLL circuit in accordance with the present invention.

Referring now to FIG. 1, there is depicted a basic configuration for achievement of the broad band PLL circuit of the present invention. This is constituted from a proportional control unit 3000, an integral control unit 2000, and an oscillator 100, wherein two separate loops are formed one of which is a loop for use in feeding an output from the oscillator 100 back to the oscillator 100 through the proportional control unit 3000, and the other of which is a loop for feedback of an output from oscillator 100 via integral controller 2000 to oscillator 100. More practically the oscillator 100 is such that its output signal Sv is controlled by the proportional controller 3000 by using both a control signal S1 that is generated by the proportional control unit 3000 from an input signal Sin and the output signal Sv of the oscillator and a control signal S2 as generated by the integral control unit 2000 from an input frequency Sin and an output frequency Sv of oscillator 100.

In the broad-band PLL circuit of the present invention the proportional control unit 3000 is provided for use in controlling an output frequency of the oscillator 100 in such a way that the control signal S1 is generated based on a difference between the input signal Sin and output signal Sv. The integral control unit 2000 is for control of the phase of an output signal of the oscillator 100 in a way such that the control signal S2 is generated from a phase difference between the input signal Sin and output signal Sv.

In the broad-band PLL circuit thus arranged, the proportional controller 3000 first causes the output signal Sv of oscillator 100 to be synchronized in frequency with the input signal Sin; then, the integral controller 2000 lets the output signal Sv be synchronized in phase with input signal Sin.

Thus, it is possible to perform well stabilized operations even where the difference in frequency between an input signal and output signal is significant.

The broad band PLL circuit of this invention will now be explained in greater detail below.

Figure 2:
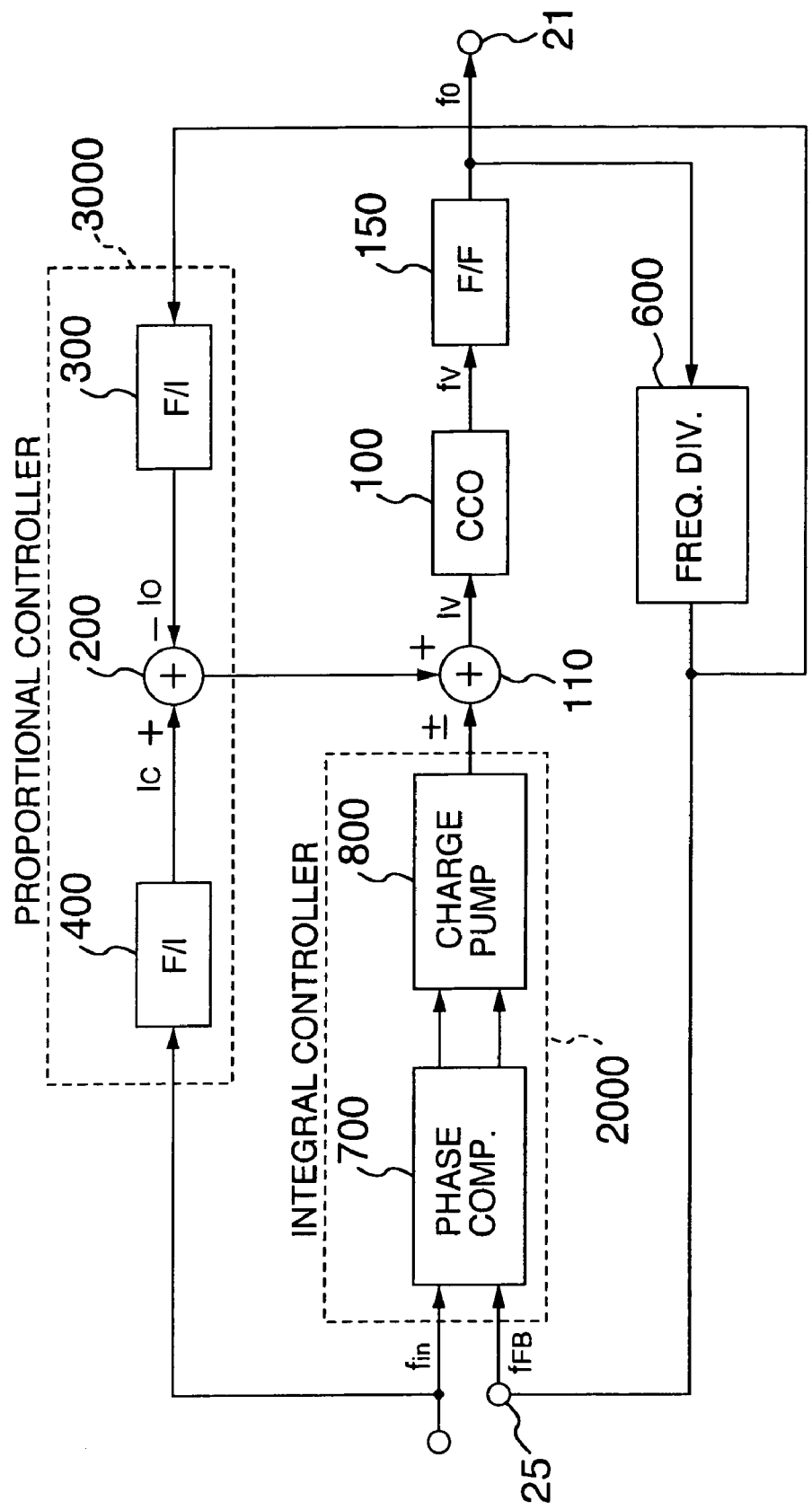
FIG. 2 is a diagram showing a configuration of the broad band PLL circuit of this invention.

FIG. 2, which illustrates a configuration of one practical example of the broad-band PLL circuit. This broad band PLL circuit is designed to employ a current-controlled oscillator (referred to as "CCO" hereinafter), wherein the proportional control unit 3000 shown in FIG. 1 is configured from two F/I converters 300, 400 and a current adder circuit 200 whereas the integral controller 2000 consists essentially of a phase comparator 700 and charge pump circuit 800. The CCO 100 is also arranged so that its output frequency fv is fed back to the proportional controller 3000 and integral controller 2000 via a flip-flop (F/F) circuit 150 and frequency divider 600 for adjustment of the duty cycle ratio concerned.

A loop operation of the integral controller 2000 in this broad band PLL circuit is as follows. The phase comparator 700 operates to compare in phase an input frequency fin and feedback frequency fFB to each other for generation of a current in accordance with a phase difference at the charge pump circuit 800 to thereby control the CCO 100 by using a current signal via the current adder 900. A signal as output from CCO 100 is then frequency-divided by the F/F 150 and frequency divider 600 into 1/N, which is again input to the comparator 700 for causing the phase of an output terminal 25 to be finally synchronized with the phase of the input signal.

A loop operation performed by the proportional controller 3000 is as follows. An input signal of input frequency fin as input from an input terminal 10 is converted by an F/I converter 400 excellent in linearity into a setup current Ic, which is amplified by the current adder circuit 200 to become a control current Iv which is then input to CCO 100. CCO 100 outputs an output signal of output frequency fv in accordance with the control current Iv. This output signal is then frequency-divided by the F/F 150 and frequency divider circuit 600 into 1/N for input to the F/I converter 300 to thereby output an output current Io. Whereby, this control system is in its equilibrium state at a point of Ic≈Io; at that time, the frequency at the output terminal 25 of frequency divider circuit 600 becomes equal to the input frequency fin.

Assuming here that the gain of an input-side F/I converter 400 is K1 (MHz/PA) whereas that of an output-side F/I converter 300 is K2 (MHz/μA), a relation between the input and output of each F/I converter 300, 400 may be given as:

$$Ic = K1 \cdot fin,$$

$$Io = K2 \cdot (fv/N). \quad \text{Eq. (1)}$$

Additionally, suppose that the current adder circuit 200 is sufficiently significant in control gain; then, Ic=Io. Thus, Equation (2) is given as follows:

$$K1 \cdot fin = K2 \cdot (fv/N),$$

$$fv = (K1/K2) \cdot fin. \quad \text{Eq. (2)}$$

By making the two F/I converters 300, 400 using the same circuitry of the same constant, K1/K2=1 is established from Equation (2)—in this case, fv=N·fin. This demonstrates that as the relation of input/output frequencies is determinable by the ratio of K1/K2 as indicated in Equation (2), even when non-linearity is found in the frequency/current characteristics, the overall characteristics will be linearized as far as K1 and K2 are the same characteristics.

As shown by Equation (2), unlike traditional phase control schemes using standard PLLs, the control system disclosed herein is of proportional frequency control; accordingly, both the response and the frequency accuracy are determined only by the F/I converters 300, 400 to thereby enable achievement of high-speed control with increased accuracy.

Note here that as the input/output characteristics of the frequency divider circuit 600 and F/I converters 300, 400 are such that linear operabilities are guaranteed, the input frequency fin relative to the broad band PLL circuit and the output frequency fv of CCO 100 are kept proportional in relation to each other even where the CCO 100 per se is nonlinear in property and even when the frequency gets higher. Further, even when a frequency difference between the input frequency fin and feedback frequency fFB is significant, use of the loop containing therein the proportional controller 3000 makes it possible to set the feedback frequency fFB at the input frequency fin at high speeds, which in turn enables accomplishment of the intended functionalities of the PLL.

Other advantages of the broad band PLL circuit shown in FIG. 2 are as follows:
(1) It is possible to accurately set up the output frequency (center frequency) fv of the CCO 100 in a way proportional to the input frequency fin.
(2) Use of the frequency divider circuit 600 makes it possible to attain any intended oscillation within a higher marginal oscillation region.
(3) Use of two F/I converters 300, 400 in pair permits the resulting characteristics to be given by a ratio between them, which makes it possible to reduce risks of possible errors and unwanted drifts or else as compared to the case of mere use of a single one.
(4) The center frequency of the CCO 30 at or near the accuracy of F/I converters 300, 400 may be almost accurately established at all time thereby reducing a pull-in time period required for the PLL circuit.

Figure 3:
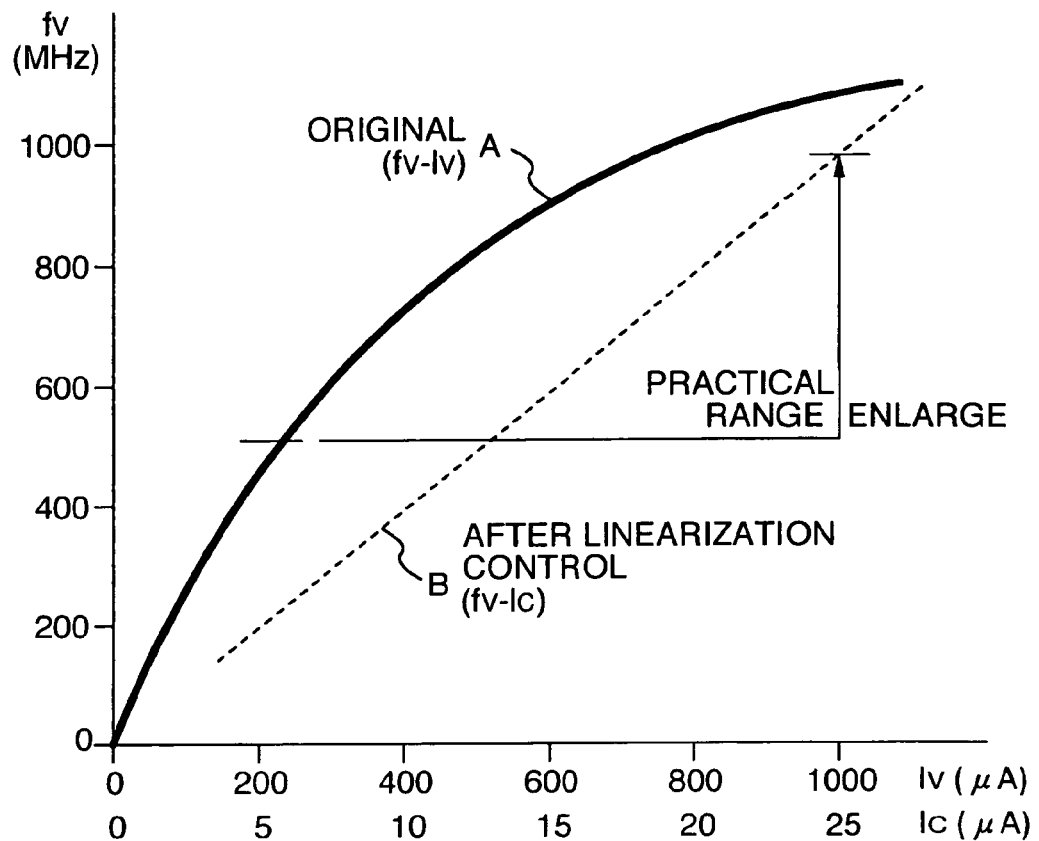
FIG. 3 is a diagram showing input/output characteristics of a proportional control unit and oscillator of the broad band PLL circuit of the invention.

FIG. 3 is a graph showing a input current Iv versus output frequency fv characteristic of the CCO 100 used singularly along with the linearization control input current Ic vs. output frequency fv characteristic thereof.

Curve "A" in FIG. 3 indicates the input/output characteristic of CCO 100 per se, wherein the CCO 100's gain fv/Iv behaves to gradually decrease in linearity due to saturation with an increase in current—at a point near or around 1,000 MHz, the linearity decreases down at 1/10 of that of low frequency or below.

Figure 4:
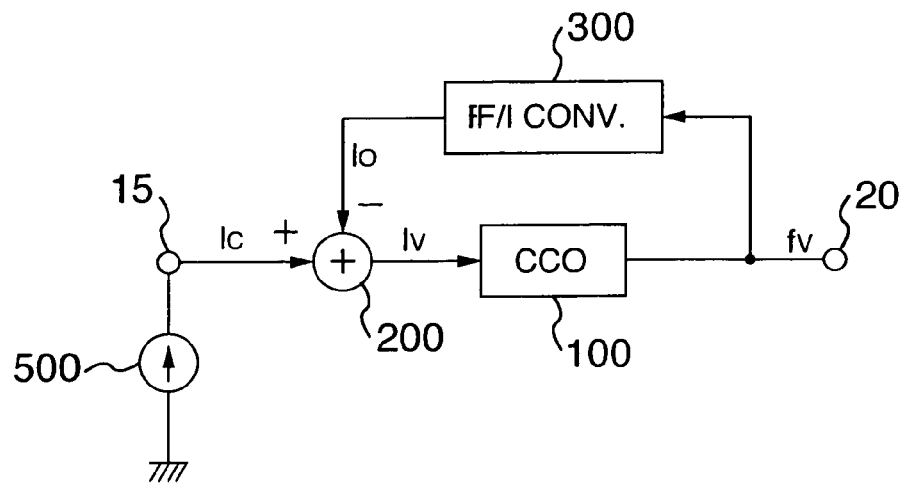
FIG. 4 is a diagram showing a basic configuration of the proportional controller used in the broad band PLL circuit of the invention.

Curve B of FIG. 3 indicates the input/output characteristic of circuitry shown in FIG. 4.

The circuitry of FIG. 4 shows a configuration of a linearization control unit operatively associated with the CCO 100 as included in the broad band PLL circuit shown in FIG. 2. This control system is arranged so that the output frequency fv of CCO 100 is fed back via the F/I converter 300 whose input/output characteristics is excellent in linearity. A set current Ic as has been input via an input terminal 15 from an input current source 500 is summed or added by a current adder circuit 200 with an output current Io of the F/I converter as fed back thereto. The resultant added current by the current adder circuit 200 is then input as a control current Iv to the CCO 100, which outputs an output signal of frequency fv in accordance with this control current Iv. Here, as the current adder circuit 200 is arranged to input the current Ic with a positive polarity and current Io with negative polarity and let a difference (Ic–Io) therebetween be the control signal Iv, this control system is controlled in the state of Ic–Io=0.

The input/output characteristic of this control system becomes a characteristic represented by B of FIG. 3, wherein the linear output range of the CCO 100 is virtually expanded. In other words, according to the control system of the circuit shown in FIG. 4, the control gain fv/Ic is kept at a substantially constant value while the linearity becomes extremely excellent to the extent that any possible reduction is within several percent (%). In this way, use of the F/I converter 300 high in linearity of input/output characteristics to feedback a signal makes it possible for the relation of the set current Ic that is an input versus the output frequency fv to be well linearized without being influenced by the CCO 100's characteristics.

In the way discussed above, since the F/I converter 300 that has its input/output characteristics of enhanced sustainability over a widened range is used to provide circuitry for feedback of an output signal, the input/output characteristics of the circuit as a whole may exhibit a stabilized linearity over an extended range.

Figure 5:
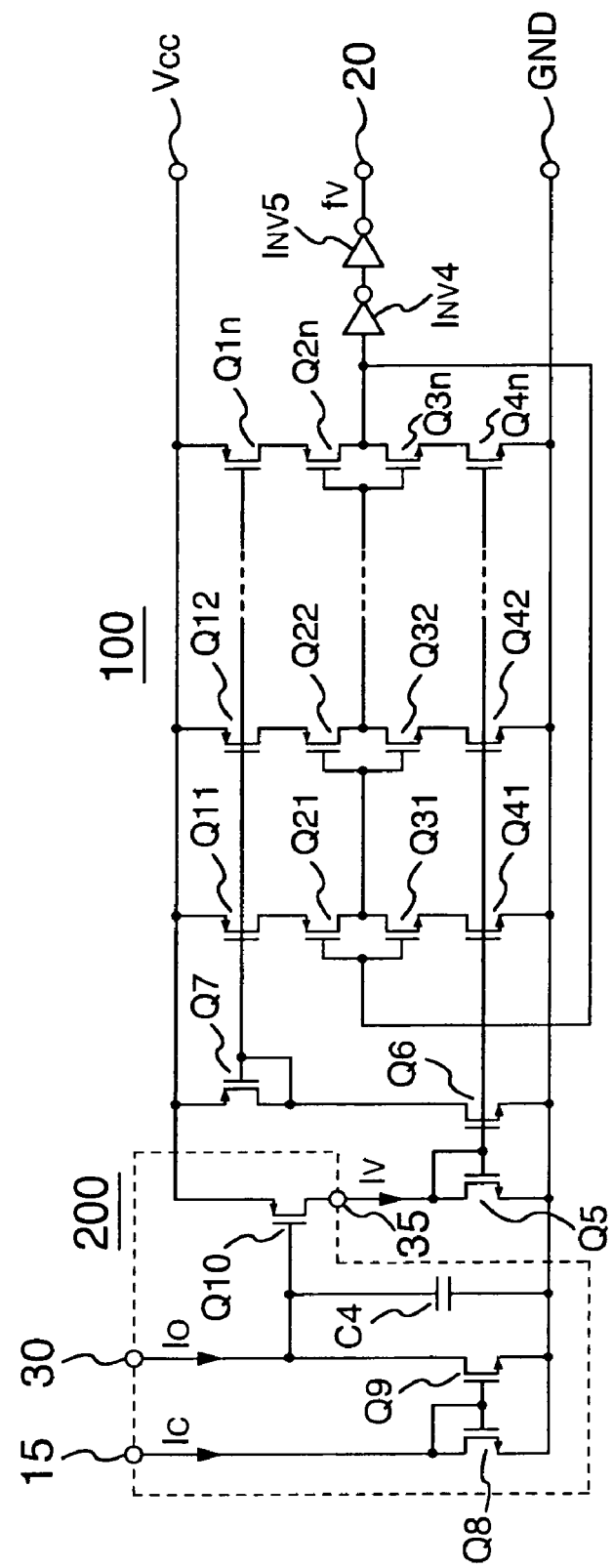
FIG. 5 is a diagram showing a circuit configuration of a current converter circuit and oscillation circuit of the invention.

FIG. 5 illustrates a detailed configuration of the current adder circuit 200 and CCO 100 shown in FIG. 4. In FIG. 5, a circuit shown within a block of dotted lines is the current adder circuit 200. The current adder circuit 200 is configured including a pair of NMOS transistors Q8, Q9 and PMOS transistor Q10 plus capacitor C4 of small capacitance. The current adder circuit 200 has two input terminals 15, 30 and one output terminal 35 and operates in a way as will be set forth below.

When letting a set current IC be input to the input terminal 15 while causing an output current Io of the F/I converter 300 to be input to the input terminal 30, the transistor Q9 changes or varies in drain current in accordance with a relation between the values of Ic and Io. Practically, if Ic<Io then a drain voltage of the transistor Q9 behaves to increase in potential; otherwise, if Ic>Io then the drain voltage of transistor Q9 potentially decreases. Accordingly, if Ic>Io then a control current Iv at the output terminal 35 increases; if Ic<Io then the control current Iv of output terminal 35 decreases. The current gain of this current adder circuit 200 is proportional to a value given as gm9·gm10·γ9, where gm9, gm10 are the conductances of transistors Q9, Q10, and γ9 is the impedance of transistor Q9. Thus, it is possible to achieve extremely high gain.

In FIG. 5 the CCO 100 is configured from a ring counter of CMOS inverters of odd-numbered stages of transistor pairs Q21, Q31, Q22–Q2n, Q32–Q3n. In addition, a constant current circuit that consists of transistors Q11–Q1n, Q41–Q4n is inserted on the Vcc side and GND side of each stage of ring counter, causing these constant current circuits to be connected to an output terminal 35 of the current adder circuit 200 through transistors Q7, Q5 which constitute a current mirror circuit.

As the current gain of the current adder circuit 200 is extremely high as discussed above, the CCO 100 is capable of letting the output frequency fv of CCO 100 change with a change in control current Iv at significantly high sensitivity.

An explanation will next be given of a detailed configuration of the F/I converter 300 below.

Figure 6:
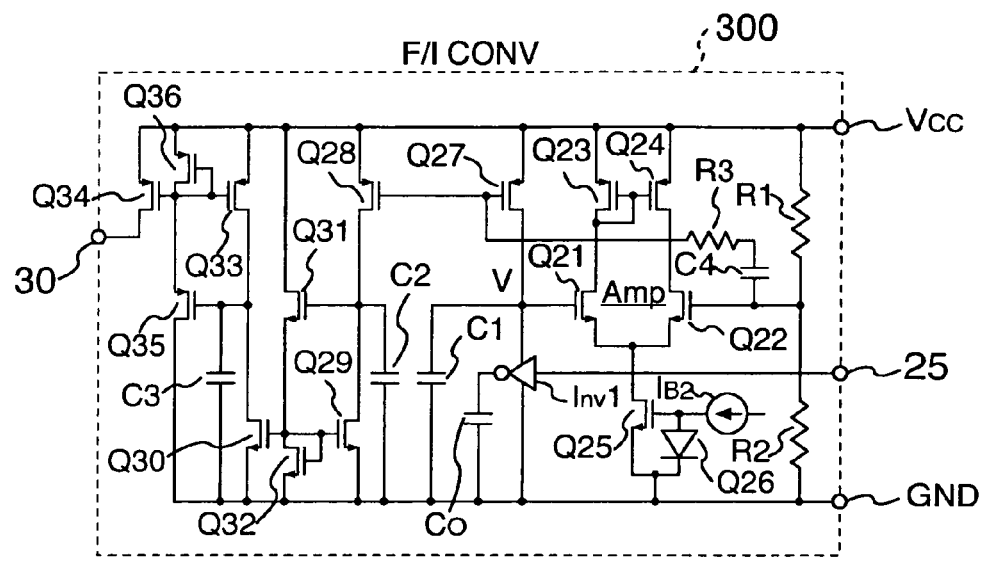
FIG. 6 is a diagram showing a circuit configuration of an F/I converter of the invention.

See FIG. 6, which shows a detailed circuit configuration of the F/I converter 300. The F/I converter shown in FIG. 6 is arranged so that a CMOS push-pull inverter Inv1 and a capacitor Co at the output thereof constitute a charging/discharging circuit, whose charge current is designed to be output from an output terminal 30 via a filter of multiple stages of current mirror circuits leading to transistors Q27–Q34.

A differential amplifier Amp arranged by a transistor differential pair Q21, Q22 and transistors Q23, Q24, Q25, Q26 is used to negatively feed back the power supply-side voltage of the inverter Inv1 to ensure that this voltage remains constant at all times. Note that the capacitor C1 is a smoothing capacitor for use in suppressing any rapid voltage potential change at a point V. In this way, as the inverter Inv1's power supply-side voltage is negatively fed back via the gates of transistors Q27, Q28 constituting a current mirror circuit, it is possible to eliminate any deviation of a voltage as potentially divided by resistors R1, R2 from Vcc thereby achieving a constant voltage required.

An operation of the F/I converter 300 thus arranged is as follows.

When a pulse voltage of frequency f is input from the input terminal 25, the inverter Inv1 operates so that an inverter output becomes "low" when its input is at "high" level, thereby causing the capacitor Co to become at 0(V). When the input is at "low" level, the inverter Inv1's output becomes "high" causing the capacitor Co to be charged up to V(V). Letting the inverter repeat such low/high at the frequency f results in the capacitor Co repeating charging/discharging operations between 0-V. Accordingly, the current I as supplied from the point V to the inverter becomes I=Co·V·f, which indicates that it becomes a pulse current proportional to the frequency f. The pulse current thus obtained is extremely high in wave height value and thus is not preferable for use as any feedback signal. Then, in order for this pulse current to be smoothed into a virtually complete DC current, improve the symmetry between the primary side (Q27, Q29, Q33) and secondary side (Q28, Q30, Q34) of the multiple stages of current mirror circuits consisting of transistors Q27–Q34 to ensure that the linearity between them is sustained over a wide operating current density while at the same time increasing the impedance as looked at from a folding node with smoothing capacitors such as capacitors C2, C3 being inserted at nodes (point B, point C) of high impedance respectively. A pulse current that has flown in the transistor Q27 of the current mirror circuitry thus arranged attempts to flow into Q28, Q29 to be smoothed thereby and then flow through Q30, Q33 to be further smoothed thereby and is finally output from an output terminal 30 of Q34 as an almost perfect DC current.

With such an arrangement, it is possible to obtain an output proportional to an input over a wide range. Input/output characteristics of the F/I converter 300 stated above are shown in FIGS. 7A and 7B. FIGS. 7A–7B are input/output characteristics in the case of the power supply voltage=2.5V and point V voltage= 1.5V, which well demonstrates that there is obtained an output current Io proportional to the input frequency f and capacitor Co. The linearity with respect to the input frequency f is also excellent so that the linearity within 0.5% is obtainable in a range of from 10 to 100 MHz. Additionally, the filter of the F/I converter 300 of FIG. 6 is also excellent in ripple and response to the extent that the ripple is 0.05% and the settling at 95.5% is within 5 μs even at the inputting of 10 MHz.

optionally, in order to further improve the control accuracy, let two F/I converters 300, 400 be identical in characteristic: As has been shown in the F/I converter of FIG. 6 for example, it possible to reduce the dependency due to the capacitor layout either by common use of reference voltage-divider resistors R1, R2 or by subdivision for layout of a reference capacitor Co into multiple portions thereby allowing the resultant disposed reference capacitors to be alternately assigned to the capacitors of two F/I converters 300, 400.

Figure 8:
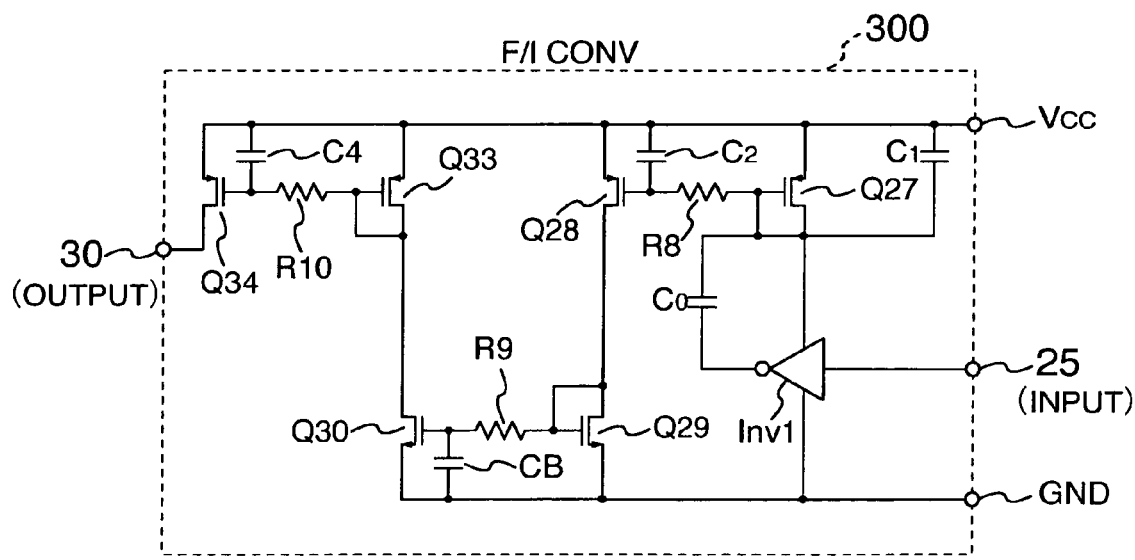
FIG. 8 is a diagram showing a configuration of another F/I converter of the invention.

Additionally, making simpler the configuration of two F/I converters 300, 400 will also be effective in view of voltage reduction and/or operation deviation; in this respect, an F/I converter with more simplified configuration is shown in FIG. 8.

The F/I converter of FIG. 8 is an F/I converter that eliminates use of the differential amplifier Amp as used in FIG. 6. In this F/I converter the other end of the load-side capacitor Co of the charging/discharging inverter Inv1 is connected together with the power supply terminal side of the charging/discharging inverter Inv1 and is then coupled to an input side of a first current mirror circuit consisting essentially of transistors Q27, Q28. Further, the capacitor C1 is connected in parallel to an input-side transistor of the first current mirror circuit. Further, the first current mirror is coupled at its output to a second current mirror circuit with respect to transistors Q29, Q30; the second current mirror circuit is connected to third current mirror circuit consisting of a pair of transistors Q33, Q34 for introduction to an output terminal 30. Each of CR filters—R8 and C2, R9 and C3, R10 and C4—for reduction of current ripple components is used between the primary side and secondary side of each current mirror. In this connection circuit, it is possible to relatively reduce a change in signal current flowing into the input transistor of the first current mirror circuit, which in turn makes it possible to obtain relatively good linearity (2% or less at 10–1000 MHz) even where the power supply voltage-side terminal voltage of the inverter Inv1 is not subjected to constant voltage production at an amplifier(s).

The F/I converter with the above arrangement is such that when an alternating on/off voltage is input to the input terminal 25, the capacitor Co is charged via the inverter Inv1 up to Vcc–Vd (Vd: diode forward voltage of Q27) causing a pulsate current to flow in the transistor Q27. And, a secondary current with ripple reduced flows in the transistor Q28. Further, a DC output is obtained from the output terminal 30, which is smoothed by the second and third current mirror circuits to be proportional to the input frequency. The circuit shown in FIG. 8 is designed to employ no differential amplifiers so that it is capable of operation with a lower voltage than ever before.

Although the F/I converter discussed above is arranged so that the first current mirror circuit is folded back at the PMOS circuit due to the fact that the charging/discharging inverter Inv1 of the capacitor Co is on the power supply side, the charging/discharging inverter Inv1 may alternatively be on the ground side—if this is the case, the same is established even when the first current mirror circuit is replaced with PMOS circuit and sequentially folded.

In addition, although in the filter using the current mirror of FIG. 8 has been shown with the three-stage configuration in a way similar to that in FIG. 5, use of only one stage is permissible if the CR time constant is increased for increase of ripple reduction amount per stage.

Figure 9:
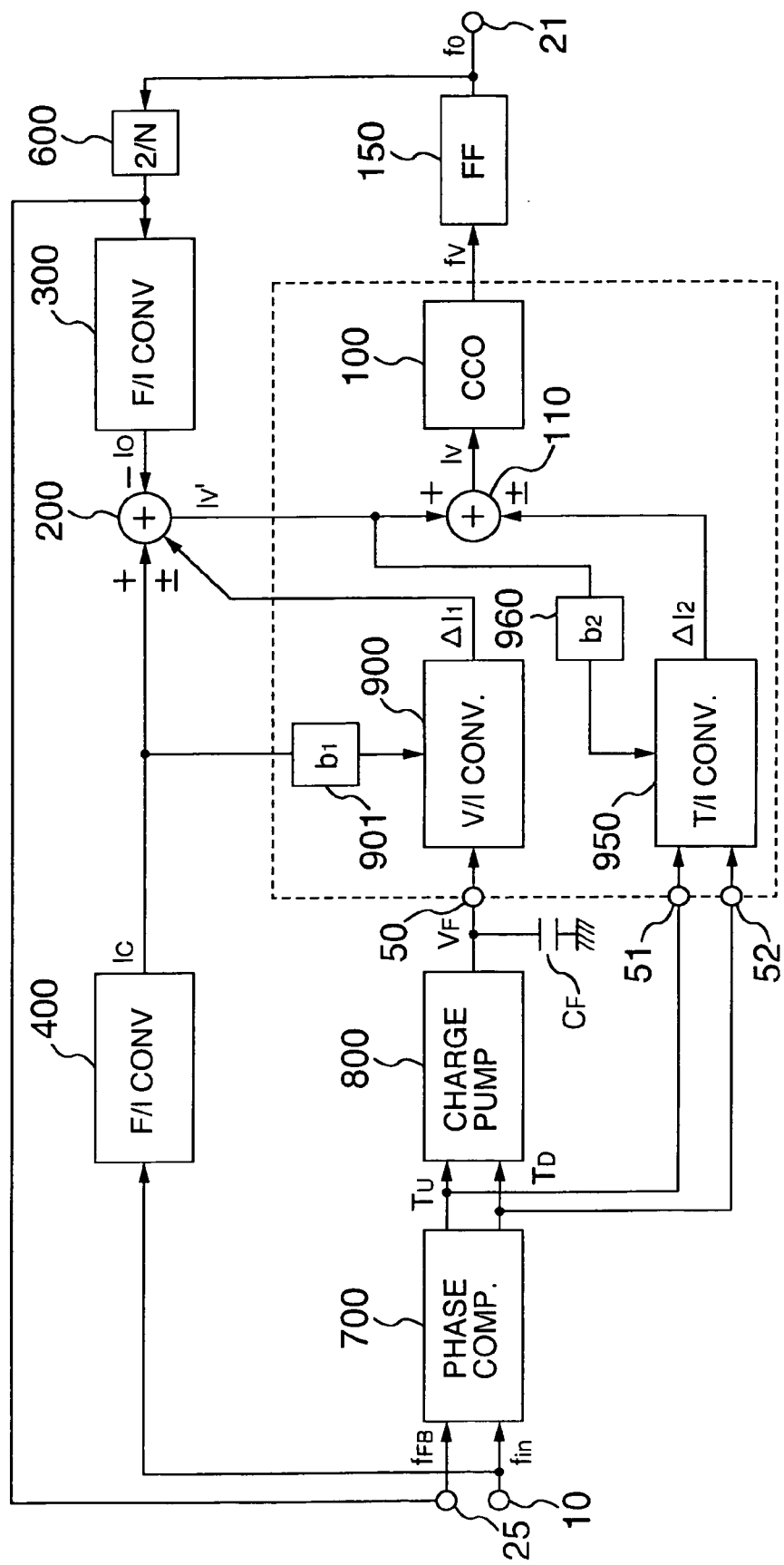
FIG. 9 is a diagram showing in block form a detailed configuration of the broad band PLL circuit of the invention.

A circuit which more practically shows the broad band PLL circuit shown in FIG. 2 based on the configuration of each unit stated supra is depicted in FIG. 9.

An input signal of input frequency fin as input to the input terminal 10 is input to a phase comparator 700 for comparison in phase with a signal of frequency fFB as fed back from a VCO block to thereby output an up-pulse (TU) and down-pulse (TD). This up-pulse (TU) and down-pulse (TD) are then input to a charge pump circuit 800 whereby a signal is output in accordance with a phase difference to be converted into a voltage VF by a filter capacitor CF for input to the VCO block.

The voltage VF as output from the charge pump circuit 800 is converted by a V/I converter 900 to a corresponding current, which is then input as an input control current ΔI1 to the current adder circuit 200. Note here that although an output of an F/I converter 400 is input from a coefficient circuit 910 to the V/I converter 900, this is aimed at adjustment of the V/I converter 900.

Further input to this current adder circuit 200 are a set current Ic equivalent to the input frequency fin via an F/I converter 400 and an output current Io corresponding to the output frequency fo of the flip-flop (FF) 150 via F/I converter 300. At the current adder circuit 200, this circuit adds these input currents together and outputs a control current Iv' of the CCO 100.

On the other hand, the up-pulse (TU) and down-pulse (TD) as output from the phase comparator 700 are directly used as an input of the VCO block and are converted by a T/I converter 950 to a lead signal current ΔI1 for stabilization. Note that the T/I converter 950 is designed so that the control current Iv' is input via a coefficient circuit b2 as an adjustment signal for conversion.

The control current Iv' added by the current adder circuit 200 and the lead signal current ΔI2 are finally summed together at a current adder circuit 110 to be input as a control current Iv to the CCO 100.

With the broad band PLL circuit thus arranged, the difference between currents of two F/I converters 300 and 400 is taken prior to a phase pull-in operation of the PLL, which makes it possible to accurately set up the output frequency fv of the CCO 100 at high speeds depending on the operation speed and accuracy of the F/I converters.

Thereafter, a frequency difference and/or phase difference that can exist between the input frequency fin of input terminal 10 and the output frequency fo of output terminal 21 will be subject to accurate integral control by a negative feedback sampling control system which is comprised of a circular loop including the frequency divider circuit 600, phase comparator 700, charge pump circuit 800, filter CF, V/I converter 900, current adder circuit 200 and CCO 100, whereby any possible frequency difference and phase difference between the input and output thereof may become substantially zero. Further, extremely narrow up (TU) and down (TD) pulses as generated at an output of the phase comparator 700 in the constant state with a phase difference identical to virtually zero are separately added to an input of the CCO 100 through the T/I converter 950 as lead (proportional) control other than the integral control to become a dumping operation for stabilization of the system. Note that for linearization of the control gain relative to the CCO 100, the reference of the V/I converter 900 is taken from the set current Ic side whereas the reference of T/I converter 950 is from the Iv' side. This means realization of two points desirable for control of the PLL circuit as follow. First, the CCO control range is automatically determined in a way proportional to a presently available value of the output frequency of CCO 100; second, the linearity of a control current of high-speed signals may also be corrected because of the fact that even where the CCO 100 suffers from nonlinearity such as saturation or else, such is reflected to the control current Iv being input to CCO 100.

Figure 10:
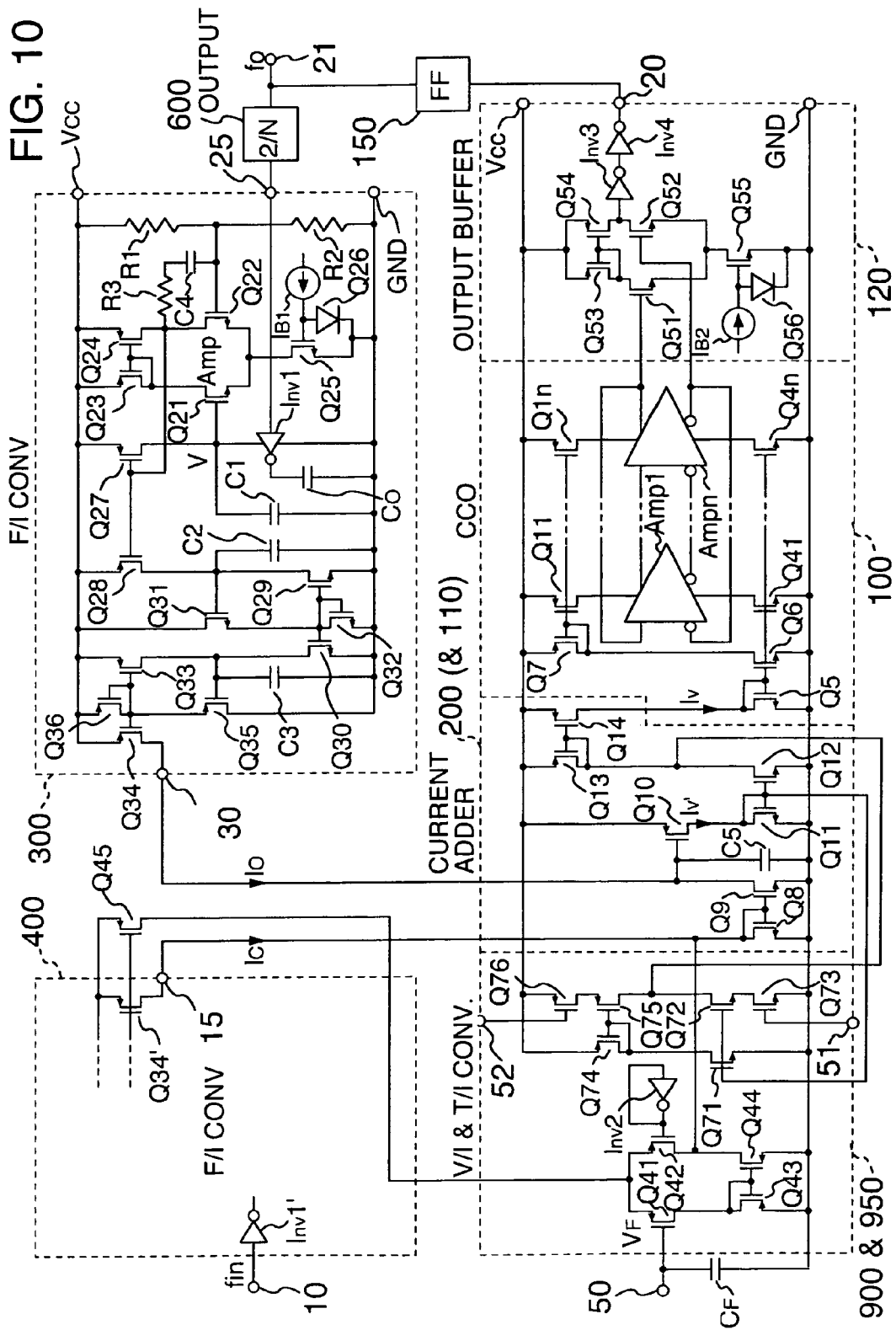
FIG. 10 is a diagram showing a circuit configuration of the broad band PLL circuit of the invention.

See FIG. 10, which depicts a detailed circuit configuration of respective blocks of FIG. 9. Note that the phase comparator 700 and charge pump circuit 800 of FIG. 9 are omitted herein. F/I converters 400, 300 of FIG. 10 are the same in configuration and characteristic as those discussed previously in conjunction with FIGS. 6 and 7A–7B. Ring counters Amp1–Ampn of the CCO 100 are each comprised of a differential amplifier capable of offering operability at higher frequencies. A differential output of such ring counter Amp permits a signal of oscillation frequency fv to be output via an output buffer 120. The output buffer 120 is arranged including a differential single-ended converter stage consisting of Q51–Q55 along with inverter amplifiers Inv3, Inv4. A V/I converter 900 is constituted from a differential amplifier stage that includes transistors Q41–Q44 and bias inverter Inv2, an output of which stage is added to a set current Ic at a node on the drain side of transistor Q8. A T/I converter 950 is formed of circuitry including transistors Q71–A76, whose reference bias is given from a transistor Q11 of the current adder circuit 200. And an input of T/I converter 950 is given from terminals 51, 52 whereas an output is applied to a transistor Q13 of current adder circuit 200. While a detailed configuration and operation of the current adder circuit 200 is the same as those in FIG. 5, a current adder 110 is represented by letting an output of T/I converter circuit 950 be connected to a connection node of transistors Q12 and Q13.

The function of a V/I converter 900 is to generate a control current in accordance with an integration amount of a phase error of the broad band PLL circuit for application to the oscillator CCO. Explaining one practical operation thereof, a terminal voltage (integration voltage of phase difference) VF of the filter capacitor CF on the output side of the charge pump 800 is converted at the differential amplifier of Q41–Q45 into a corresponding current, which is then added to the control current Iv of CCO 100 via the current mirror of transistors 71, 72.

Lead signal generation as required for stabilization of the system during phase control of the broad band PLL circuit is such that it is produced by the T/I converter 950. More practically, it includes a constant current circuit formed of transistors Q72, Q75 and also includes switching transistors Q73, Q76. Upon receipt of up (TU) and down (TD) pulse signals from the phase comparator 700 to terminals 51, 52, Q73 and Q76 turn on causing a pulse current during such time period to be added to an output current of the differential V/I converter 900 noted above to thereby become a control current of CCO 100.

Figure 11:
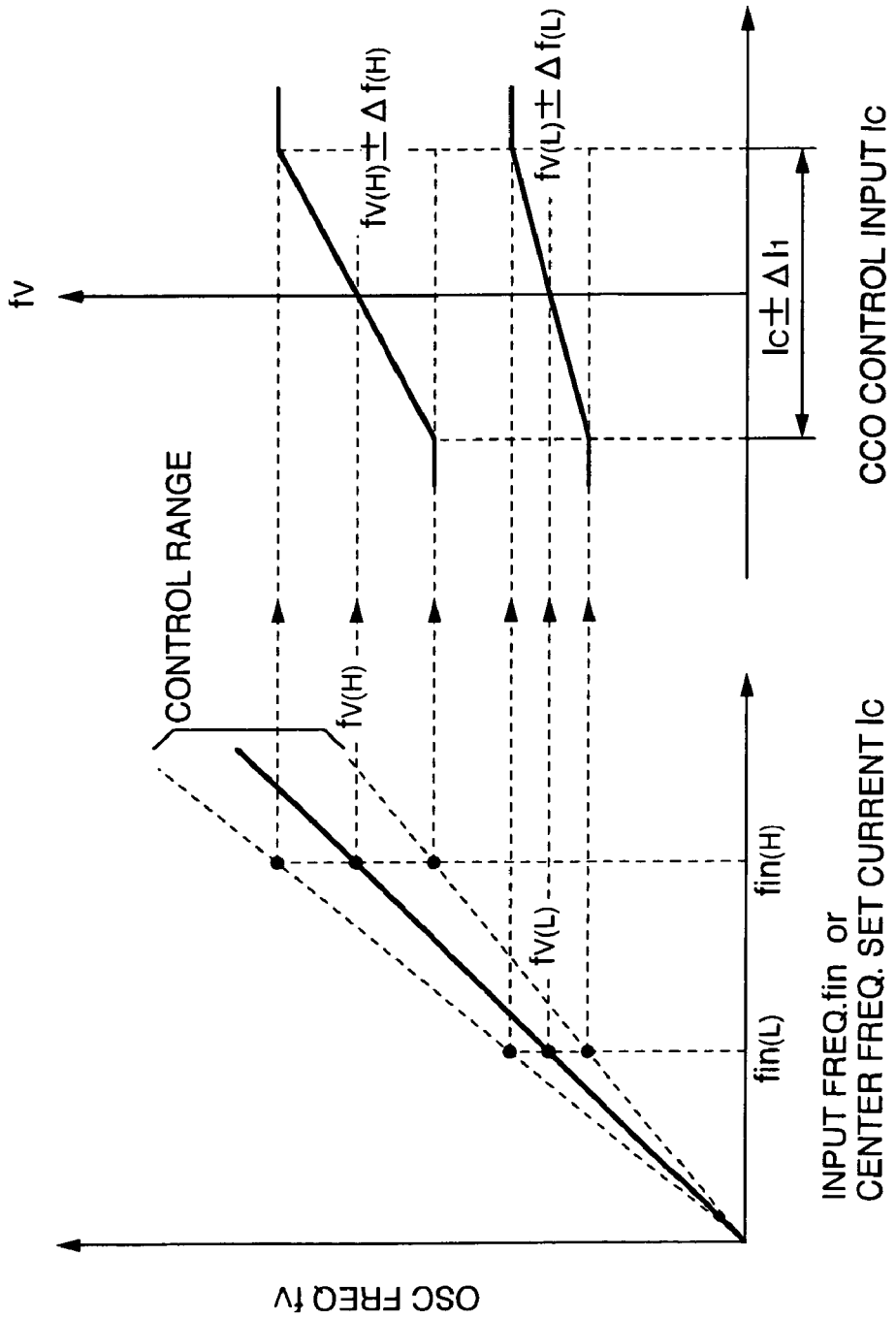
FIG. 11 is a diagram showing input/output characteristics of the broad band PLL circuit of the invention.

Referring to FIG. 11, there is shown an exemplary control range setup characteristic of linearization feedback control of the broad band PLL circuit. As shown in FIG. 11, use of the feedback control based on difference in current between F/I converters 300, 400 on input and feedback sides makes it possible to linearly set up the center of an oscillation frequency fv with respect to the high (fin(H)) and low (fin(L)) sides of input frequency fin. Further, since the reference for ±ΔI generation of a control input is based on the control current Iv of the CCO 100, the oscillation frequency's control ranges ±Δf(L), ±Δf(H) are normalized in specified ranges proportional to respective frequencies fv(L), fv(H). Enabling setup of the variable frequency range Δf of CCO 100 in a way proportional to the set value of the center frequency as discussed above may permit minimal design of a variable signal range as assigned to dynamic circuitry such as loop filters with increased affectabilities of leak noises or else in the broad band PLL circuit, which is desirable in terms of signal-to-noise (S/N) ratio enhancement during control by the PLL circuit.

It should be noted that although in the illustrative embodiment the broad band PLL circuit has been explained to employ the current-controlled oscillator CCO and F/I converters, this may alternatively be designed to use a voltage-controlled oscillator VCO and more than one frequency-to-voltage (F/V) converter for achievement of the same effects.

Figure 12:
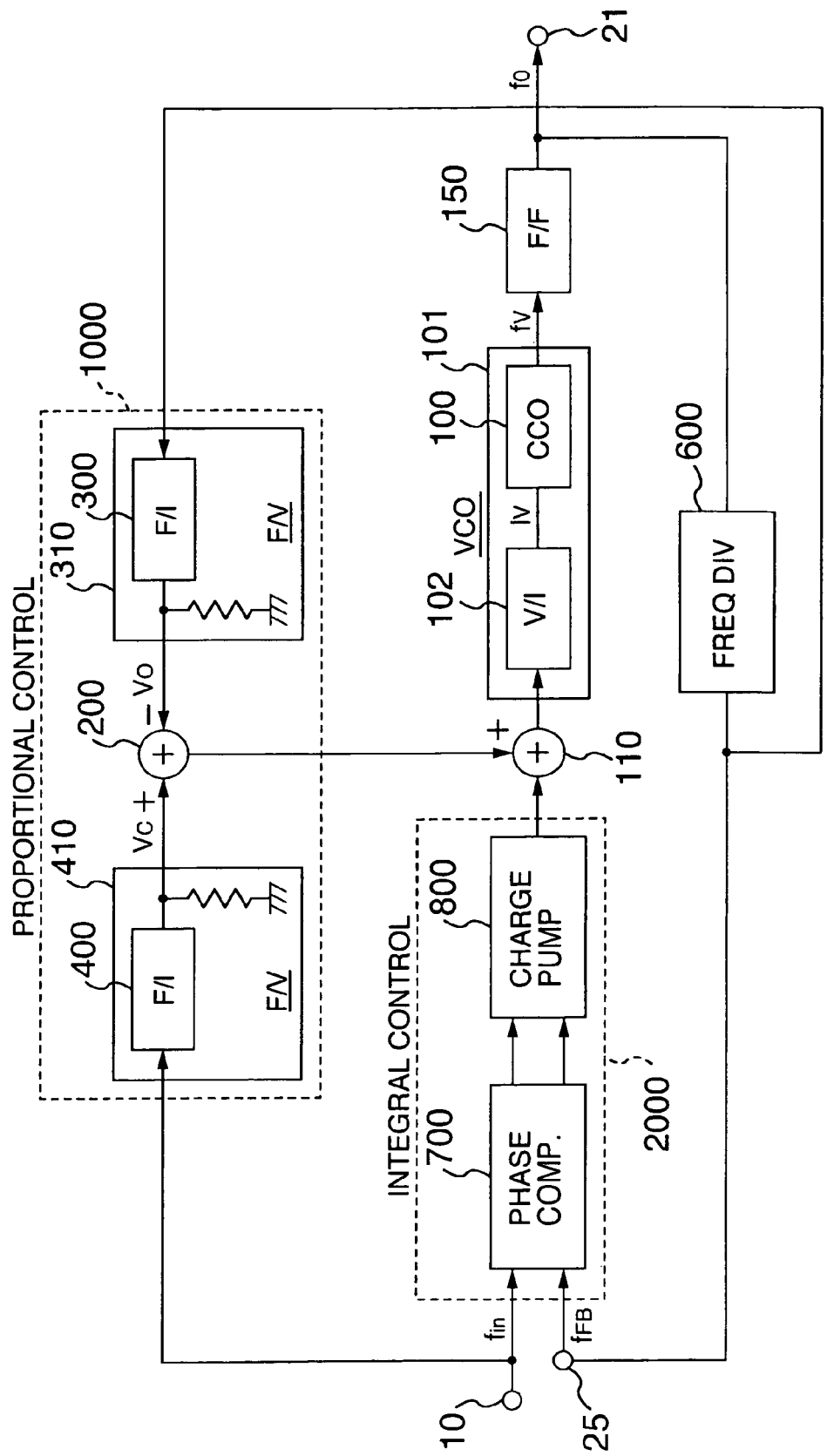
FIG. 12 is a diagram showing another configuration of the broad band PLL circuit of the invention.

See FIG. 12, which illustrates a broad band PLL circuit constituted from such voltage-controlled oscillator VCO and F/V converters. The F/V converters 310, 410 used in a proportional control unit 3000 are each arranged so that a resistor is connected to the output of an F/I converter 300, 400. This is to compensate for the linearity of input/output characteristics of F/V converters 310, 410.

While the use of the voltage-controlled oscillator VCO may also lead to achievement of the intended broad band PLL circuit in this way, letting the broad band PLL circuit be formed of the current-controlled oscillator CCO and F/I converters will be more effective in order to attain low voltage operations.

As explained above, the technique of the present invention for accomplishment of the broad band PLL circuit by use of a specific oscillator with nonlinear characteristics may increase or maximize the operation range of PLL circuit up to its upper limit, which results in extension of application range. Especially, for highly advanced microprocessors, requirements for miniaturization of components used therein and reduction of operating voltages as well as frequency increase are all getting more strict every year, which in turn makes it more important to achieve the nonlinearity of oscillators. In view of this, it will be particularly effective to apply the broad band PLL circuit of this invention as a PLL circuit built in such microprocessors for clock generation.

Figure 13:
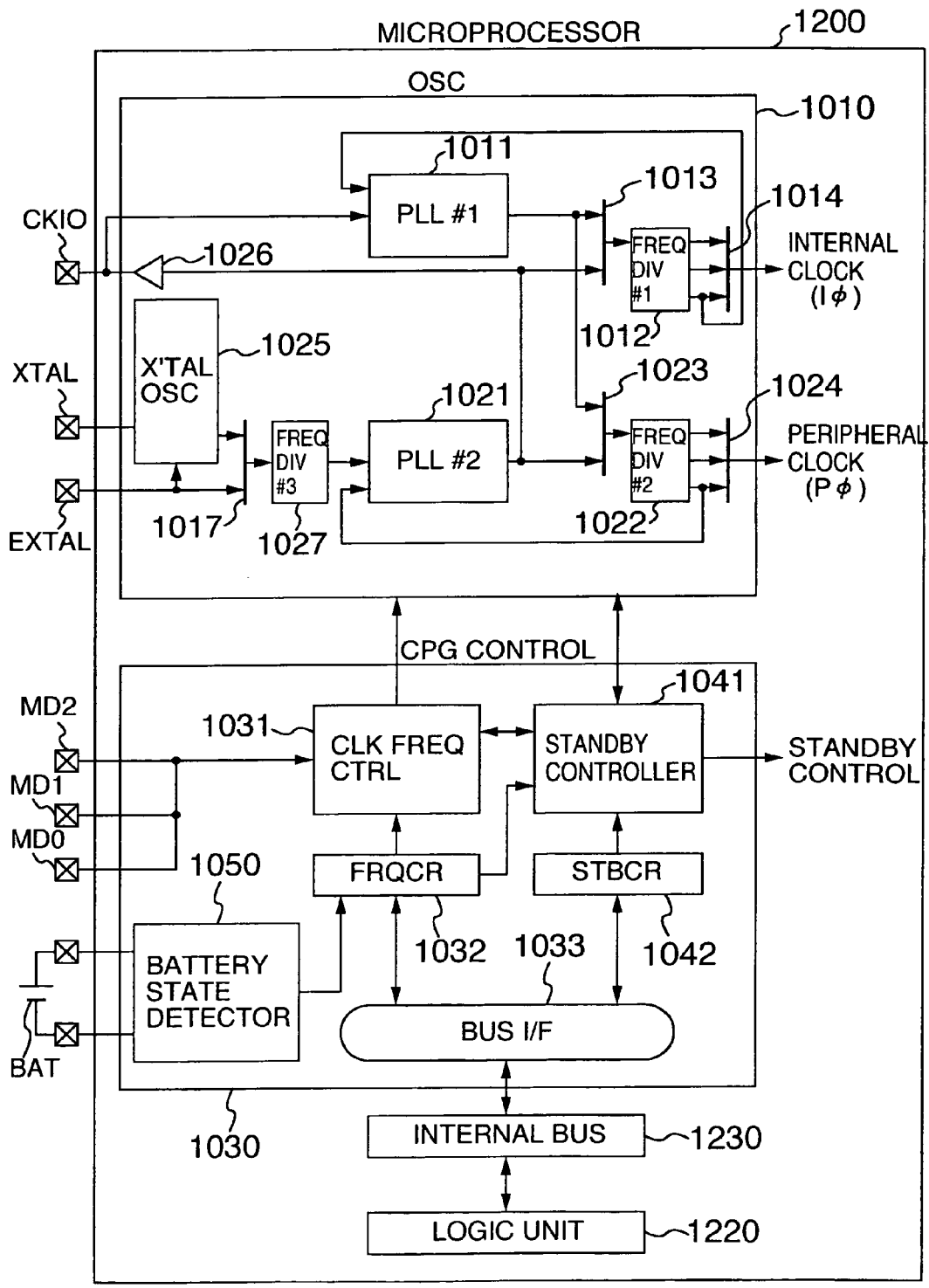
FIG. 13 is a diagram showing a circuit configuration of a microprocessor employing the broad band PLL circuit of the invention.

Turning now to FIG. 13, there is shown a configuration of a microprocessor employing a built-in broad band PLL circuit for use as a clock generator circuit. This microprocessor is arranged to include an oscillator 1010 for clock generation, oscillator control unit (CPG) 1030 for controlling the oscillation frequency of the oscillator 1010, a logic unit 1220 for performing data processing on the basis of a block signal as oscillated by oscillator 1010, and internal bus 1230 as connected between the logic unit 1220 and oscillator control unit 1030. The oscillator 1010 is designed including broad band PLL circuits 1011, 1021, selectors 1013, 1014, 1017, 1023, 1024, frequency dividers 1012, 1022, 1027, buffer 1026, and quartz crystal oscillator 1025. The selector 1017 is operable to select either one of reference clocks of the quartz oscillator 1025 coupled between terminals XTAL, EXTAL and a pulse generator externally attached to the terminal EXTAL, wherein the reference clock signal selected is frequency-divided by the frequency divider 1027 and is then input to the broad band PLL circuit 1021. An output from the broad band PLL circuit 1021 is input to the selectors 1023, 1013 and is simultaneously input to an output terminal CKIO and PLL circuit 1011 via the buffer 1026. An output of the broad band PLL circuit 1011 is input to the selectors 1013, 1023. In this way the selectors 1013, 1023 receive the outputs of two broad band PLL circuits 1011, 1021 for selection of either one of them. Those signals selected by selectors 1013, 1023 are input to the frequency dividers 1012, 1022, respectively. The frequency dividers 1012, 1022 are for frequency division of an input signal into signals of three different frequencies. The signals as frequency-divided by the frequency divider 1012 are sent to the selector 1014 so that any one of them is selected to become an internal clock Iφ. Those signals as frequency-divided by frequency divider 1022 are such that any one of them is selected by selector 1024 to become a peripheral clock Pφ. Outputs from respective frequency dividers 1012, 1022 are fed back to the PLL circuits 1011, 1021, respectively.

The CPG control unit 1030 controls at a clock frequency control circuit 1031 the selectors 1013, 1014, 1017, 1023, 1024 based on both mode control information externally supplied due to combination of terminals MD0–2 and information of a frequency control register (FRQCR) 1032 that has been set from the microprocessor by means of a software while at the same time controlling the frequency sequential magnification ratio of PLL circuits 1011, 1021 and the frequency division ratio of internal clock plus the frequency division ratio of peripheral clock. It also performs controlling of PLL stand-by, PLL enable, output enable of an output clock(s).

The CPG control unit further includes a battery state detection circuit 1050. This battery state detector circuit 1050 is operable to detect the state of a battery for setting in the FRQCR 1032 a specific value that is used to control the clock frequency in accordance with the battery stated detected. Based on this setting, it controls the frequency divider 1027 of the oscillator 1010 to thereby control the frequency of a clock(s).

Figure 14:
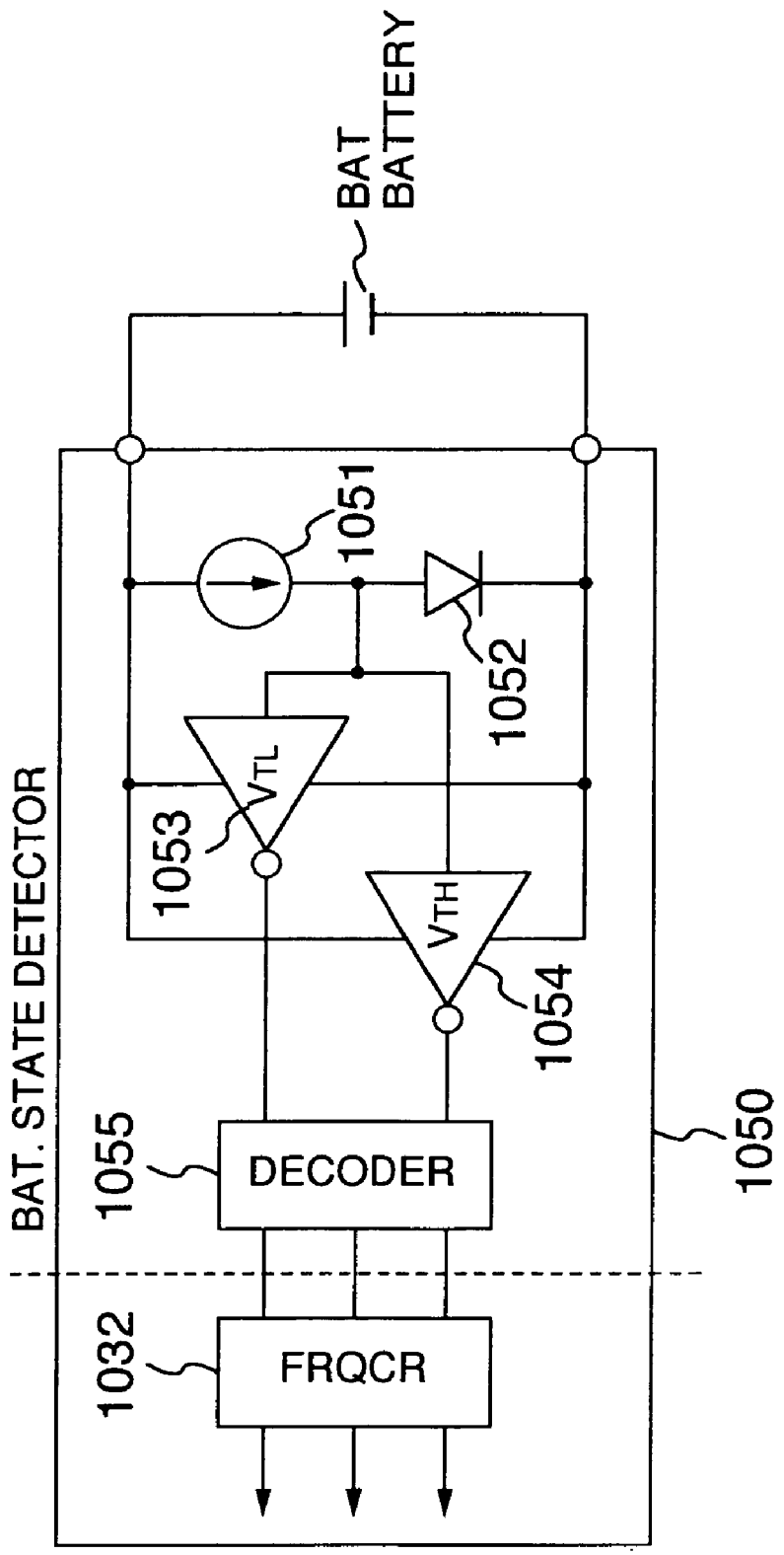
FIG. 14 is a diagram showing a circuit configuration of a battery state detector circuit of FIG. 13.

FIG. 14 shows a configuration of the battery state detector circuit 1050. The battery state detector circuit 1050 includes a constant current source 1051, diode 1052, inverter 1053 having a high threshold value VTH, inverter 1054 with low threshold value VTL, and decoder 1055. A forward-directional drop-down voltage of the diode 1052 that is biased by the constant current source 1051 is input as a reference voltage VREF to the inputs of two inverters 1053, 1054, which may exhibit three different states through comparison of the reference voltage VREF and the voltage state of a battery BAT—namely, VTH$\geq$VREF, VTH<VREF$\geq$VTL, and VTL<VREF. This state will be taken out as a binary signal, which is set at the FRQCR register 1032 for enabling selection of a clock frequency. In this way, applying the PLL with broad band operability makes it possible to select by online the operating clock frequency at a minimal value. Note that this battery state detector circuit 1050 may alternatively be arranged so that it is outside of the microprocessor; if this is the case, the output of the battery state detector circuit 1050 is input via the terminals MD0–2.

Whereby, in case the battery residue becomes less by way of example, it is possible to extend the battery's in-use time or lifetime by decreasing the clock frequency of the microprocessor.

Although the configuration for detection of the battery's state has been explained as the peripheral circuit of the microprocessor herein, letting the CPG control unit comprise detector circuitry for detecting either operating state or internal state of a peripheral circuit as connected to the microprocessor makes it possible for the clock frequency to vary in accordance with the operation state or internals state of the peripheral circuit to thereby enable enhancement of applicability of such microprocessor on a case-by-case basis.

An explanation will next be given of a case where the PLL circuit is applied to a processor that operates with a power supply voltage different in processor core from the PLL unit. In case the processor includes therein those regions that operate with mutually different power supply voltages such as 3.3V and 1.8V for example, a certain interface circuit should be required for performing conversion of a power supply voltage potential level depending on a region used to operate the PLL circuit within a clock generator circuit.

Figure 15:
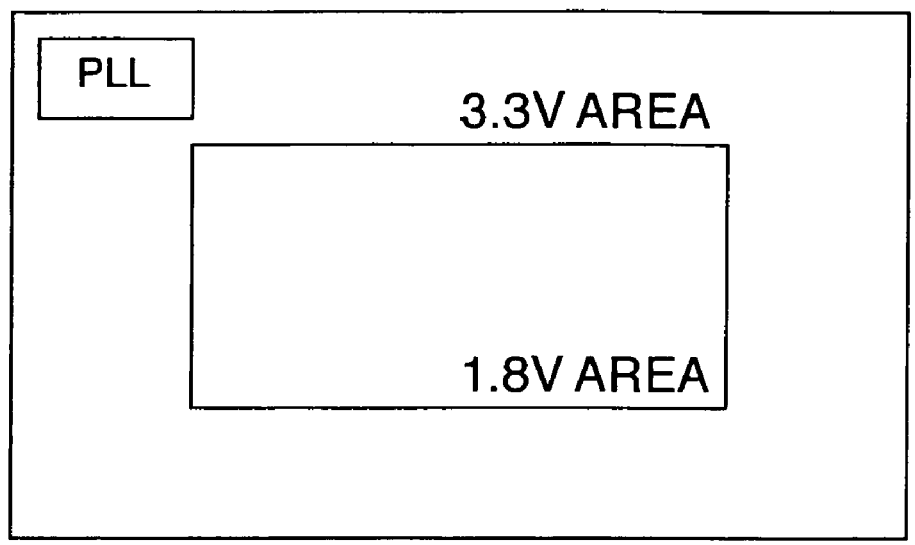
FIG. 15 is a diagram showing a first layout power supply area of the PLL circuit in the micro-processor operating with two power supplies.
Figure 16:
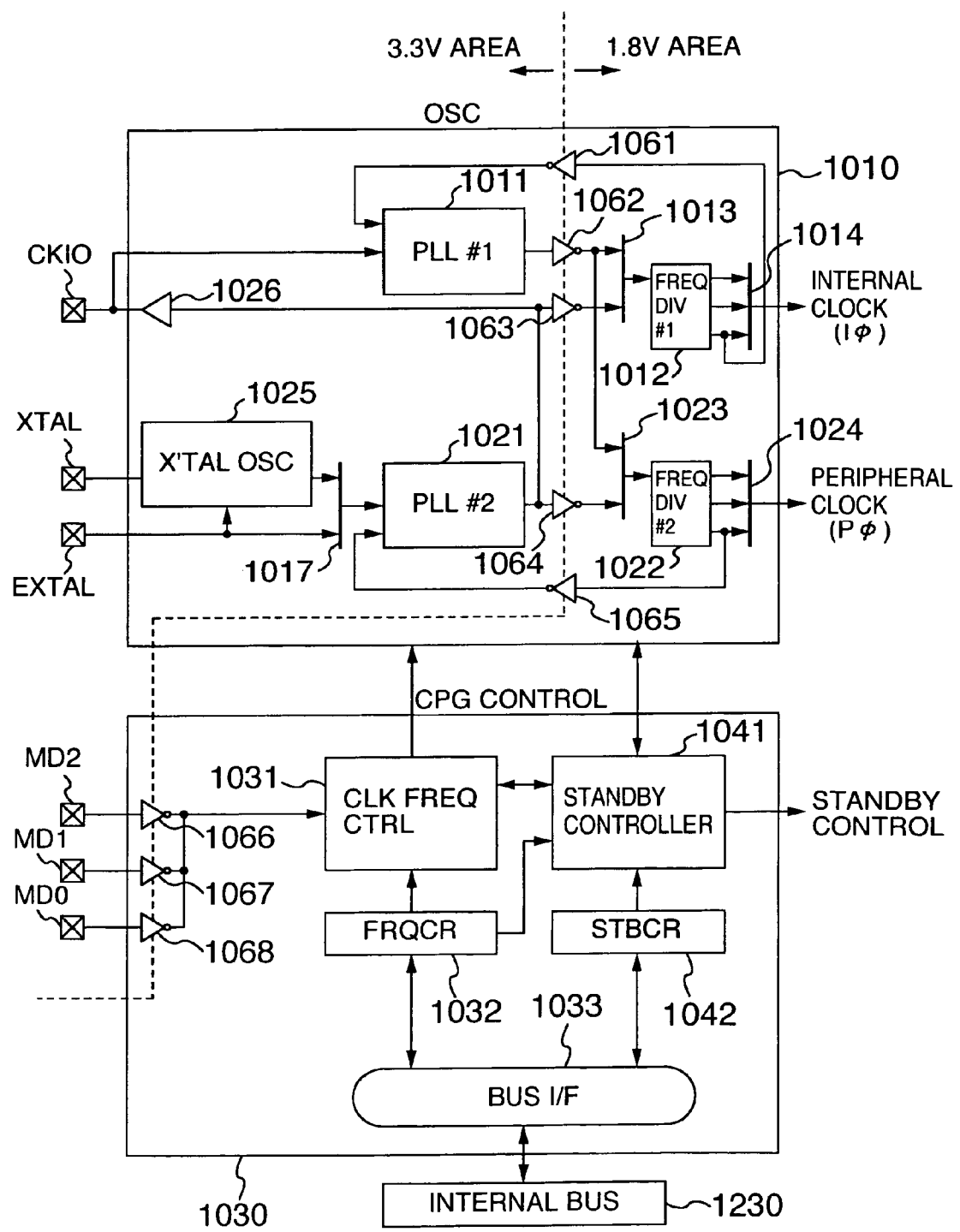
FIG. 16 is a diagram showing a practical circuit arrangement of the microprocessor of FIG. 15.

FIG. 15 shows a case where a PLL circuit for clock generation is disposed in a 3.3V-power supply region that is the same as the power supply used for an interface circuit with external circuitry. More practically, as shown in FIG. 16, an interface for level conversion of operation signals of 3.3V and 1.8V including level conversion inverters 1061–1068 is laid out at a portion designated by dotted lines. These level conversion inverters 1061–1068 are achievable by changing the size of more than one transistor using a logic threshold value. Letting the PLL circuit operate in a 3.3-V region in this way makes it possible to use an existing, proven 3.3-V operable PLL circuit.

Figure 17:
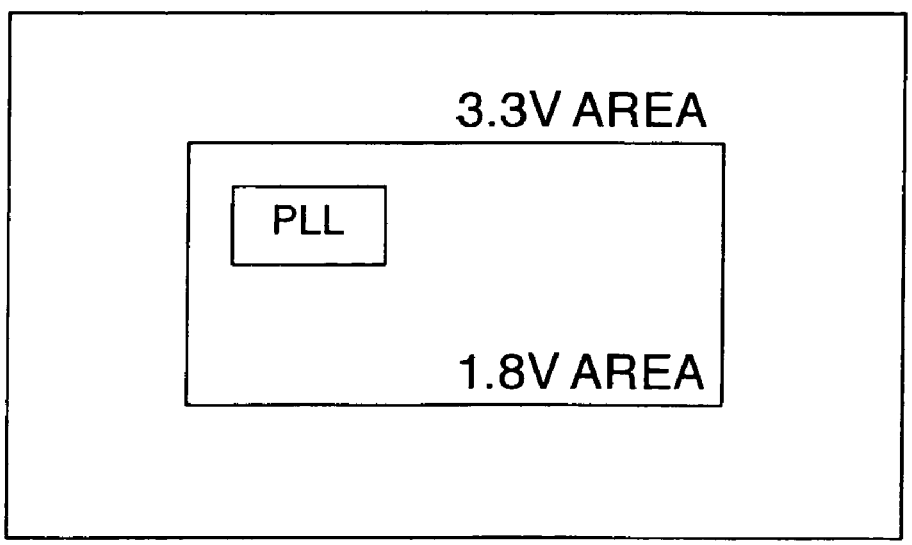
FIG. 17 is a diagram showing a second layout power supply area of the PLL circuit in the microprocessor operating with two power supplies.
Figure 18:
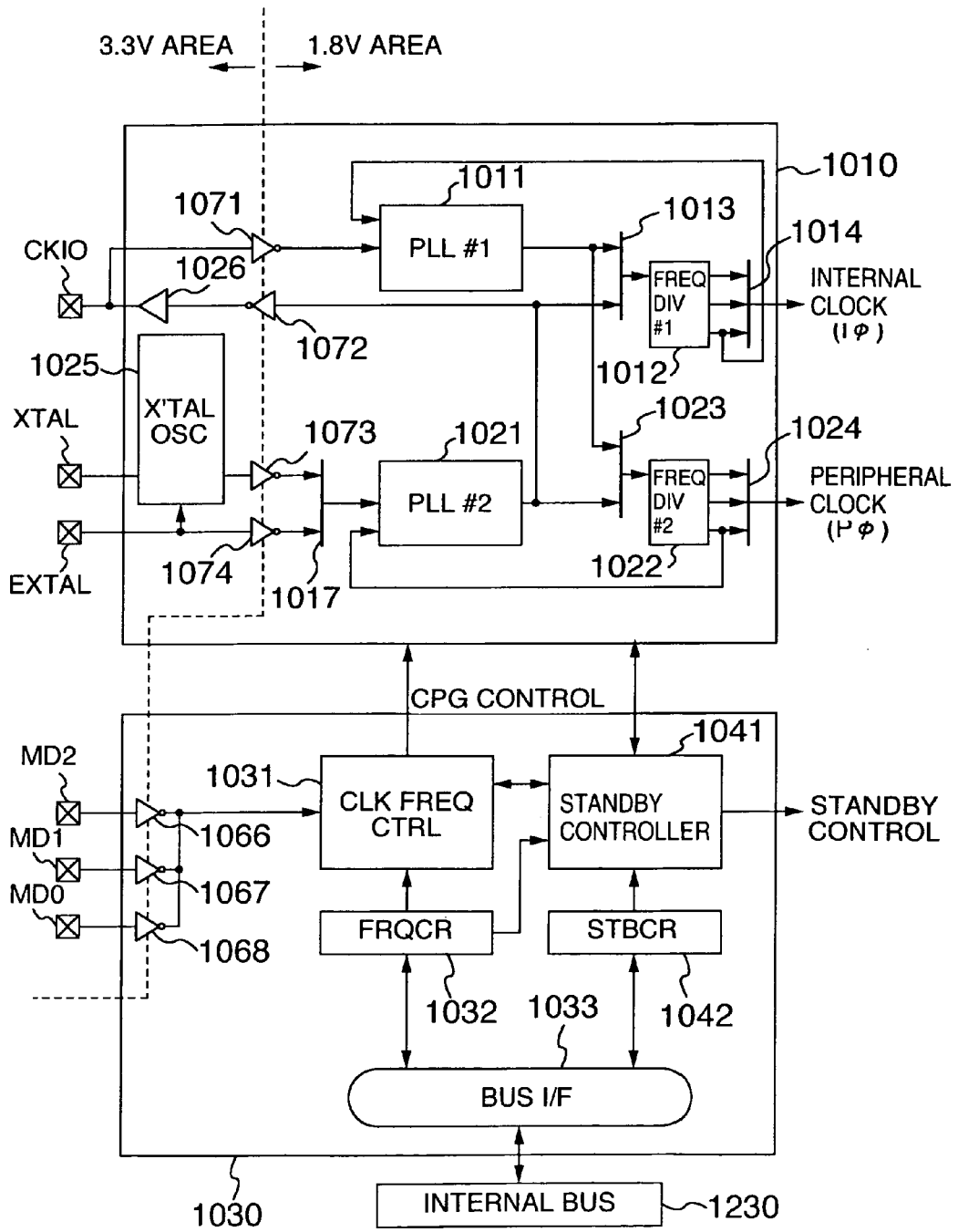
FIG. 18 is a diagram showing a practical circuit configuration of the microprocessor of FIG. 17.

An explanation will next be given of a case where the PLL circuit is laid out in a 1.8V power supply region of the same core as the logic unit as shown in FIG. 17. FIG. 18 shows a configuration in this case, wherein level conversion interfaces 1066–1068, 1071–1074 are disposed at a portion designated by broken lines. In this case the PLL operates with a low voltage of 1.8V so that IP design (ASIC design) may easily be done because of low power dissipation due to the PLL's operability at 1.8V and easy establishability of required operation margins due to the same voltage/process as the logic unit core and also the ability to make it integral with the core unit.

Note that until here, the specific case has been explained of employing currently available PLL circuit when the processor is designed to have different power supply regions therein. However, as stated previously, such traditional PLL circuit is inherently narrow in range of usability, which requires manufacture of such PLL circuit in accordance with respective power supplies. In contrast thereto, the broad band PLL circuit of the present invention is capable of operating in a broad band as stated supra and, for this reason, may be applied even to the processor having different power supply regions without modifying the principal configuration of such broad band PLL circuit.

Figure 19:
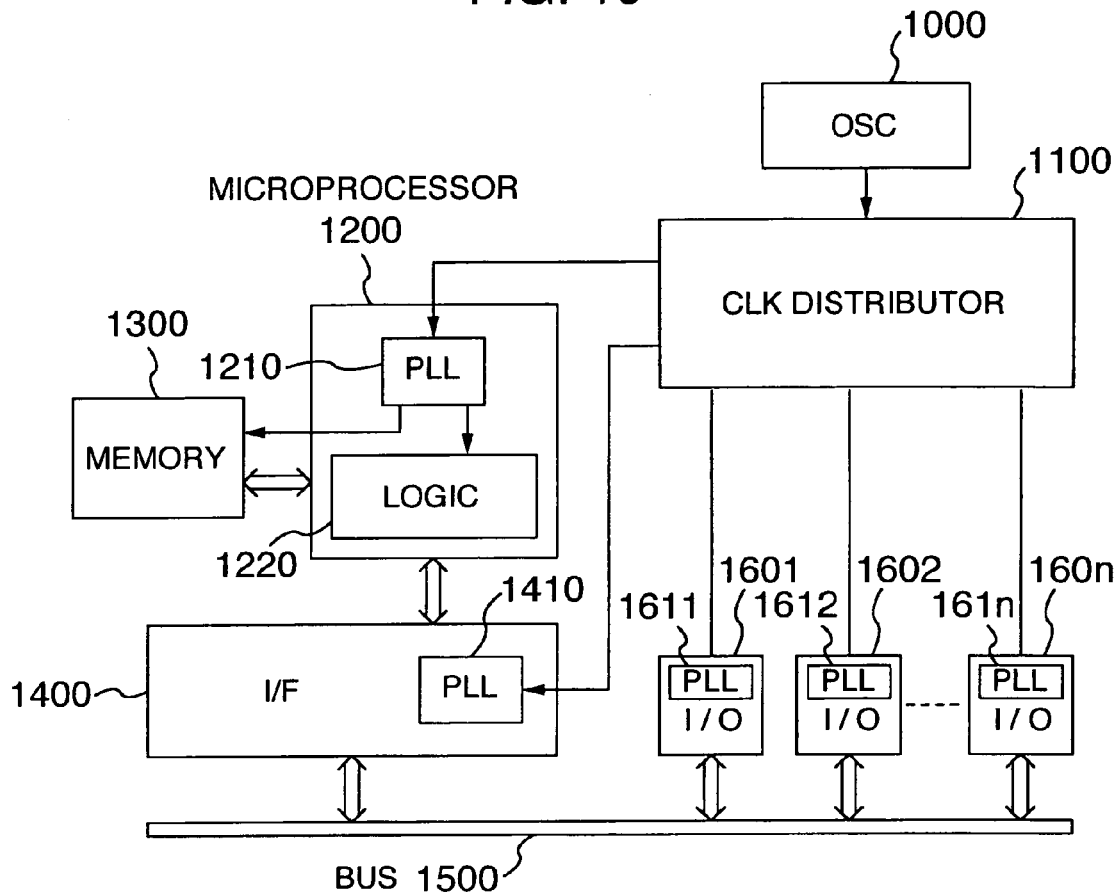
FIG. 19 is a diagram showing a configuration of a processor system employing the broad band PLL circuit of the invention.

Next, a microcomputer system is shown in FIG. 19, which is arranged to employ the microprocessor shown in FIG. 13. This microcomputer system includes an oscillator 1000 for oscillation of a reference clock toward the outside of a microprocessor 1200, a clock distribution system 1100 for supplying (distributing or delivering) this reference clock to respective portions, the microprocessor 1200 performing processing upon receipt of a clock as distributed by this distributor system 1100 from the CKIO terminal shown in FIG. 13, an interface circuit 1400 for receiving at its input the clock(s) as distributed by the clock distributor system and for outputting a result from the microprocessor to a bus 1500 while inputting data from the bus 1500 to output it to the microprocessor 1200, and input/output devices 1601–160n for receiving a clock or clocks from the clock distributor system to perform data send/receive operations relative to external equipment. These components such as the microprocessor 1200 and interface circuit 1400 plus input/output devices 1601–160n are designed to include broad band PLL circuits 1210, 1410, 1611–161n respectively and receive at their inputs those clocks as distributed from the clock distributor system. Whereby, at the microprocessor 1200, let the broad band PLL circuit 1210 operate to synchronize a clock of internal operation of the microprocessor with the clock as received from the clock distributor system and also provide access to a memory 1300 on the basis of a signal synchronized therewith while performing logical processing at the logic unit 1220. Similarly the interface circuit 1400 and input/output devices 1601–160n perform data input/output operations in a way synchronous with the clock as received from the clock distributor system. Note here that although only one microprocessor is shown in the illustrative microcomputer system, this may be replaced with a plurality of ones as the need arises. In such case, inputting of clock(s) to the broad band PLL circuit 1210 of the microprocessor is attainable by selection of the external clock input/output terminal CKIO in an input mode.

Use of the broad band PLL circuit(s) in such system makes it possible to reduce or suppress any possible clock skew inside of the apparatus while simultaneously enabling the microprocessor and interface circuit plus input/output devices to be identical in phase to one another, which in turn makes it possible to readily perform the intended data transmission in a clock synchronized way within a shortened time period.

The microprocessor 1200 and interface circuit 1400 plus input/output devices 1601–160n are each arranged on a single semiconductor substrate. Alternatively, in case these components are all arranged on a single chip along with the memory 1300, such chip may be designed so that a single broad band PLL circuit is used to distribute a clock or clocks among the microprocessor 1200, interface circuit 1400 and input/output devices 1601–160n.

As has been explained above, arranging the control system by using either the F/I converter or F/V converter with high linearity of input/output characteristics makes it possible to perform the intended linear control without depending upon the characteristics of an oscillator per se, which in turn enables achievement of the broad band PLL circuitry even when such oscillator characteristics is unknown.

To attain the broad band PLL circuit incorporating the principles of the invention, an oscillator as used therein may be such that its characteristic monotonically increases or decreases regardless of the significance of the nonlinearity thereof. Thus, it is possible to realize the intended broad band PLL circuit by use of one of various types of oscillators that have traditionally been difficult to be utilized as any variable oscillator due to the fact that the nonlinearity of an output versus a control input is too significant or alternatively the sensitivity is too high although they have broad band oscillation characteristics.

Several oscillators adaptable for use in the present invention will be explained below.

Figure 21:
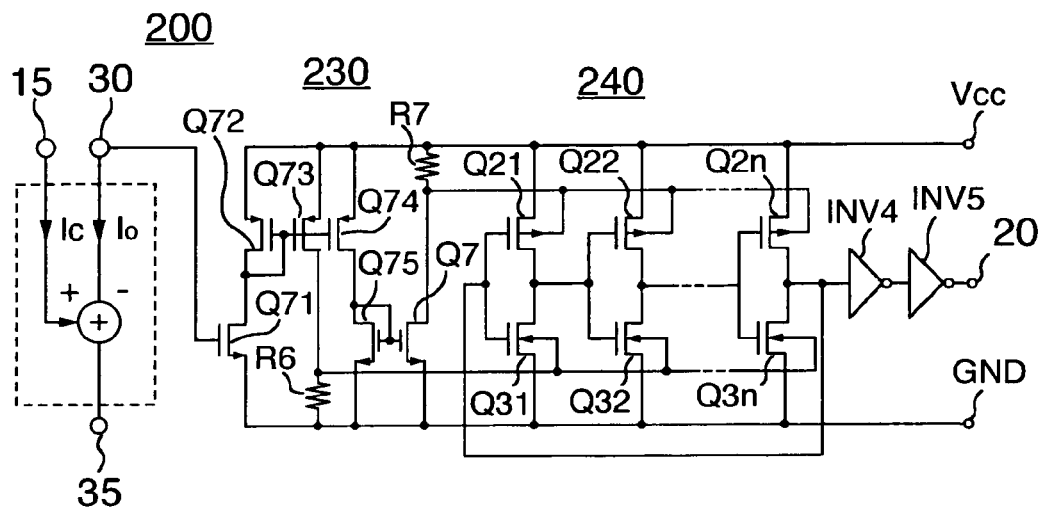
FIG. 21 is a diagram showing still another example of the oscillator applicable in this invention.

See FIG. 21, which depicts a variable oscillation circuit using a substrate voltage-controlled ring counter. In FIG. 21 also, the same or similar components or elements to those shown in FIG. 6 are designated by the same reference characters. The illustrative oscillator is designed including a current adder circuit 200, ring counter 240, and control interface circuit 230 for connection between the current adder circuit 200 and ring counter 240. The interface circuit 230 consists essentially of a transistor Q71 for constitution of a voltage amplifier stage and PMOS transistors Q71–Q74 and NMOS transistors Q75, Q76 plus resistors R6, R7 of current mirror pair. Substrate electrodes of PMOS transistors Q21–Q2n of an inverter stage constituting the ring counter 240 are connected to the resistor R7 of interface circuit 230; similarly, each of the substrate electrodes of NMOS transistors Q31–Q3n is coupled to the resistor R6 of interface circuit 230.

An operation of the illustrative variable oscillator circuit thus arranged is as follows.

Figure 22:
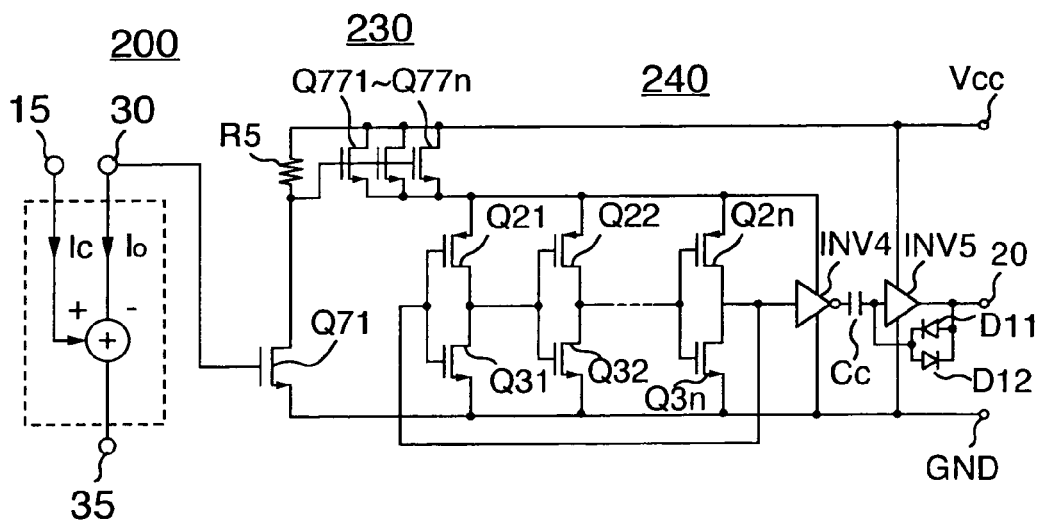
FIG. 22 is a diagram showing yet another example of the oscillator applicable in the invention.

At the current adder circuit 200 a set current Ic and an output current Io from the F/I converter 300 are processed to define a difference therebetween in a way such that if Ic>Io then the terminal 30 is low in potential causing the transistor Q71 to cut off or alternatively become extremely less in current flowing therein, resulting in any current hardly flowing in a current mirror circuit of the interface circuit 230. Thus, a potential drop of the resistors R6, R7 of interface circuit 230 becomes virtually zero causing the ring counter 240's respective transistors to exhibit no substrate biasing to thereby permit oscillation at relatively high frequencies. Next, if Ic<Io then the terminal 30 of current adder circuit 200 potentially increases allowing a current to flow in the transistor Q71 of interface circuit 230, which in turn causes respective transistors Q72–Q74, Q75, Q76 of the current mirror circuit to be forward-biased permitting flow of a current therein, which results in occurrence of a potential drop at the resistors R6, R7—i.e. creation of a substrate voltage—whereby a circuit current of the ring counter 240 decreases so that the resultant oscillation frequency is lowered. Consequently, in the state that current addition consisting of the current adder circuit 200 and transistor Q71 is sufficiently high in gain while an output of the ring counter 240 is being negatively fed back to the terminal 30 of current adder circuit 200 via an F/I converter (not shown in the drawing), Ic=Io is established letting nonlinear oscillation characteristics be linearized. FIG. 22 shows another oscillator which includes as the frequency change means of the ring counter 240 a circuit for changing or varying the power supply voltage. This circuit is operatively responsive to the relation in magnitude between currents Ic, Io of the current adder circuit 200 for letting a terminal voltage of a resistor R5 of transistor Q71 vary in potential to thereby change an output voltage of a source follower consisting of a plurality of transistors Q771–Q77n, which in turn causes the ring counter 240 to likewise change in oscillation frequency. An output of the ring counter 240 with the power supply voltage changed causes each inverter stage to change in threshold value in a current/voltage proportion manner; thus, in order to externally take out a stable output amplitude, certain level shift will be required. In the circuitry of FIG. 15, an output stage inverter Inv5 is achieved by an AC amplifier circuit that consists of a coupling capacitance Cc and diodes D11, D12 and employs a bias of nonlinear resistance.

Figure 20:
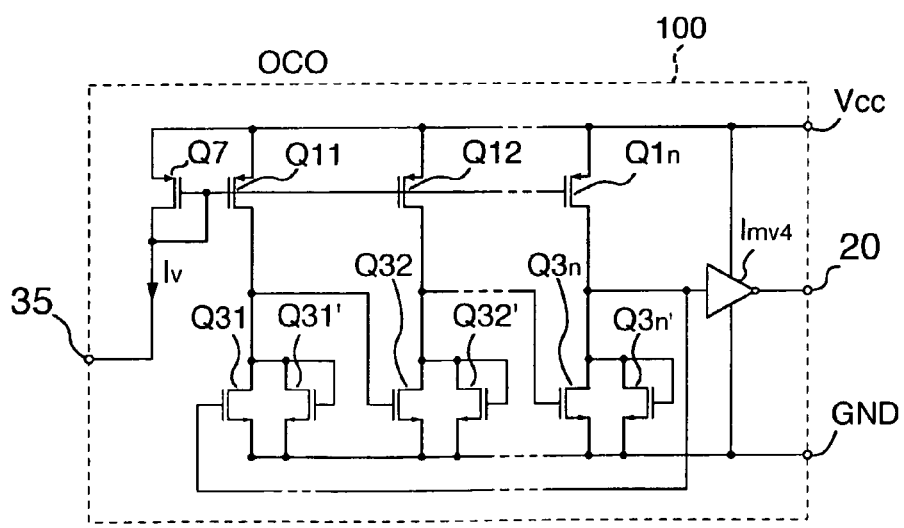
FIG. 20 is a diagram showing one example of another oscillator applicable in the present invention.

FIG. 20 shows a circuit of still another oscillator. In FIG. 20 the inverter stage constituting the ring counter is designed so that the transistor Q31 acting as an amplifier is formed of a parallel circuit of diode Q31' while letting a constant current Iv be supplied to the inverter stage via a constant current transistor Q11. The same configuration will be used to the next stage et seq., the odd-numbered stages constituting the ring counter. An operation of this inverter stage is such that when the transistor Q31 is in the turn-off state the constant current of Q11 attempts to flow into the diode Q31' while an output voltage is being clamped by the diode. Subsequently, when Q31 turns on, the flow of current is switched from the diode Q31' to transistor Q31 whereby the output voltage becomes at the ground potential thereby obtaining an amplitude corresponding to one diode in accordance with turn-on/off operations.

As the output amplitude of this circuit is limited by the diode, the resulting amplitude will not be proportional to the control current Iv but be proportional to a square root of Iv ($\sqrt{Iv}$). Thus, it becomes the characteristic of the square root ($\sqrt{}$) of the output frequency so that it becomes one preferable example of the CCO which has been limited in range of practical usability due to its significance of nonlinearity but may be broadened in band for practical implementation by use of the linearized CCO technique of the present invention. Some advantages of the CCO of FIG. 15 include: (1) an ability to easily achieve low-voltage operability due to a decrease in number of series-connected transistors, (2) capability of reduction of power supply voltage noises and influences due to diode-clamping of the output voltage on the ground potential side, and others.

As discussed above, according to the present invention, it is possible to achieve the broad band PLL circuit even when the oscillator is significant in nonlinearity or even where an oscillation output can change in amplitude, which in turn provides several technical advantages which follow.

(1) Owing to successful linearizability of the nonlinearity of CCO, the usable frequency range may be expanded to be two or three times greater than ever before.

(2) Use of the linearization technique based on the negative feedback control scheme may provide extended applicability even when details of nonlinearity are unknown (field of application is wide while reducing complexity in design procedure).

(3) Because nonlinearity correction or compensation as required in the course of micro-fabrication of highly integrated LSIs and voltage reduction plus frequency increase can be attained, it is easy to accommodate such advances in technology.

(4) As parameter management is well achievable for those systems accurately corresponding to input/output frequencies, it is possible to realize the PLL with enhanced operabilities in a wide range (for example, the frequency range is ten times greater, which leads to decreases in production cost penalty while increasing the applicability with a less kind of PLLs used therein.

(5) As the setup of the center frequency of a PLL may be done with increased accuracy, it becomes possible to shorten the pull-in time period.

(6) As setting of the center frequency is done accurately, it becomes possible to let the variable control range be a minimized range required, which in turn makes it possible to reduce noises and jitter or else in the control system.

(7) Letting the V/I conversion operate in a differential way makes it possible to suppress any possible influences from characteristic variations and/or process deviations, resulting in an increase in accuracy.

It has been described that according to the present invention, it is possible to achieve a specific PLL circuit capable of operating in a wide range while enabling linear control due to the negative feedback control without regard to the characteristics of an oscillator used.

Another advantage lies in that the use of this PLL circuit enables arrangement of a system capable of greatly reducing power consumption.

An explanation will next be given of a current switch that is applicable to the broad band PLL circuit as has been explained previously. It must be noted that this current switch may also be applied to other circuits including standard PLL circuits, A/D converter circuits, or D/A converter circuits.

Figure 23:
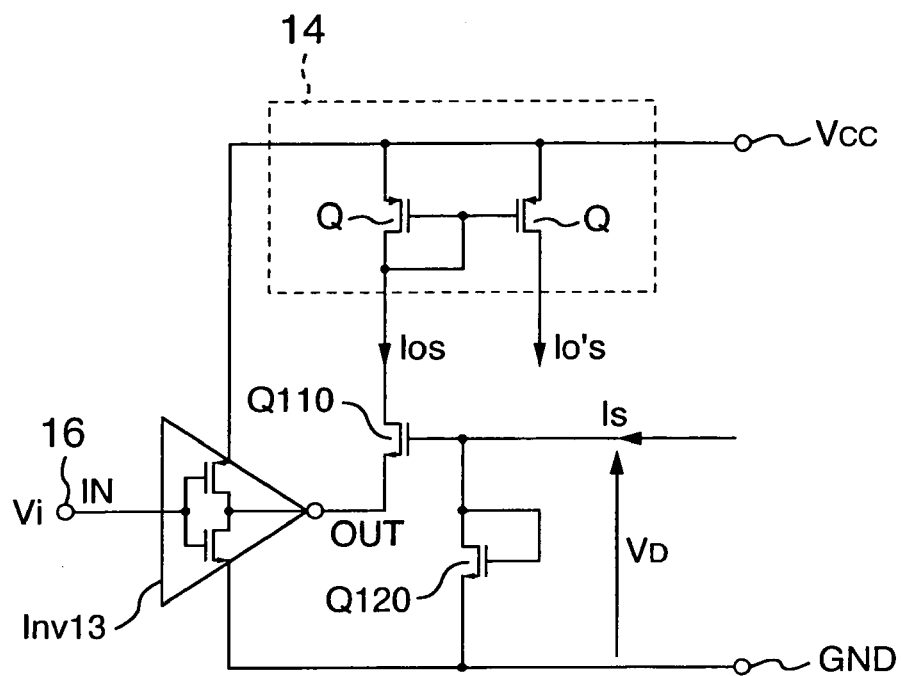
FIG. 23 is a diagram showing schematically a configuration of a current switch circuit of the invention.

See FIG. 23, which is a diagram schematically showing a configuration of a current switch circuit in accordance with a first embodiment of the present invention.

Here, reference character "Q110" designates a MOS transistor that functions as a current switch; Q120 denotes a MOS diode for permitting flow of a bias current Is; Inv13 is a CMOS inverter functioning as a voltage switch for driving the MOS transistor Q110; 14, load.

The transistor Q110 has its gate which is connected to the MOS diode Q120 that permits flow of a bias current Is. This in turn allows a forward bias voltage to be applied to the gate of MOS transistor Q110. The drain of the MOS transistor Q110 is coupled to the load 14. Additionally the MOS transistor Q110 and MOS diode Q120 make up a current mirror circuit for permitting flow of a current equal to the bias current Is when the MOS transistor Q111 is rendered conductive.

The CMOS inverter Inv13 is a complementary output circuit which exhibits a low output impedance at both of the high and low output levels. An output of this CMOS inverter Inv13 is connected to the source (low voltage-side electrode) of the MOS transistor Q110. The CMOS inverter Inv13 has its power supply-side electrodes connected to the ground GND and power supply voltage Vcc respectively.

Here, the load 14 is formed of a current mirror circuit for the purposes of indicating it in the form of circuitry with generality capable of accommodating both a sink current Ios and source current Io's. Note however that the load 14 should not be limited to the current mirror circuit alone.

In the current switch circuit thus arranged, the MOS transistor Q111 operates to turn on and off in accordance with an output level of the CMOS inverter Inv13 which changes or varies depending on a voltage value Vi of a control signal as presently input to an input 16.

More specifically, in case the voltage value Vi of such control signal is zero, the output of the CMOS inverter Inv13 becomes at the Vcc level. In this case the MOS transistor Q110 is in the reverse bias state between the source and gate thereof so that the MOS transistor Q110 becomes in the cutoff state.

On the other hand, when the voltage value Vi of the control signal changes in potential to the Vcc level, the output of the CMOS inverter Inv13 becomes zero level. In this case the MOS transistor Q110 is in the forward bias state. Due to this, the MOS transistor Q110 is rendered conductive permitting flow of a circuit current Io (substantially equal to Is).

This in turn causes a current to flow in the load 14 within a certain time period that corresponds to an application time of the control signal of the Vcc level.

Figure 24:
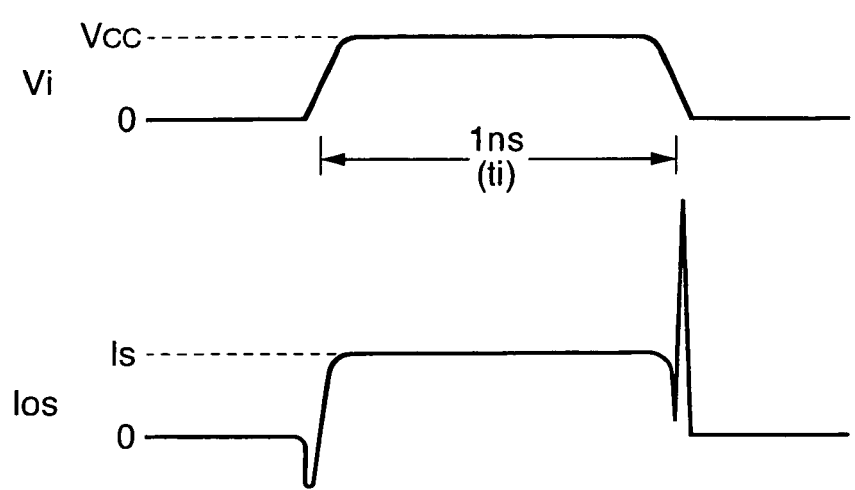
FIG. 24 is a diagram showing input/output operation waveforms of the current switch circuit shown in FIG. 23.

FIG. 24 is a diagram showing a result of simulation for investigating input/output operation waveforms of the current switch circuit shown in FIG. 23 which is constituted from a CMOS LSI of Vcc=2.5V. The operation conditions used here are as follows: the bias current Is =10 $\mu$A, control signal pulse width ti=1ns, and this pulse width's rising/falling time=100 ps.

With the current switch circuit of the illustrative embodiment the output impedance of the CMOS inverter Inv13 becomes a low impedance at both the high and low levels. For this reason, the switching transient time period of a circuit current Io flowing in the MOS transistor Q110 is substantially limited to a period in which an output voltage of the CMOS inverter Inv13 potentially varies across the bias voltage width (0V–VD (=MOS diode Q12's terminal-to-terminal voltage)) of the MOS transistor Q110 in both the rise up and fall down events. This makes it possible to achieve an extremely short settling time.

It should be noted in FIG. 24 that noise components of the circuit current Io occurring in the switching transient time period are differentiation noises of an input waveform to a parasitic capacitance between the gate and drain of more than one transistor constituting the CMOS inverter Inv13. While rise-up/fall-down current noises become an error component with respect to the ideal product value Is·ti of a current flowing in the MOS transistor Q110 once per switch-on event, such error is as small as about 1 to 2% even under such a small operating condition of Is =10 $\mu$A and ti=1ns.

In this embodiment the driver state is designed to employ the complementary output CMOS inverter Inv13 with its output level exhibiting a low output impedance at the high, intermediate, and low levels. A further feature is that letting an output of the CMOS inverter Inv13 be connected to the source (low voltage-side electrode) of the MOS transistor Q110 serving as a current switch to thereby drive the MOS transistor Q110 allows any parasitic capacitance occurring at a to-be-controlled terminal of the MOS transistor Q110 to decrease when compared to the case of coupling the output of CMOS inverter Inv13 to the gate (high voltage-side electrode) of MOS transistor Q110 for driving the MOS transistor Q110.

With such an arrangement, as the current switch drive settling time is generally determinable depending upon a transient time due to the parasitic capacitance of a switching transistor, it is possible to make smaller the output impedance of the driver stage with respect to both rise-up and fall-down events, which in turn makes it possible to reduce the requisite setup time of the MOS transistor Q110 thereby enabling achievement of high-speed operation of the current switch. For instance, a CMOS-LSI becomes capable of operating at high frequencies of the order of GHz whereas power circuitry is capable of operating at frequencies of the order of MHz.

Another advantage of the illustrative embodiment is that as the current switch is source-driven, it is possible to reduce mirror effects to the output side and/or transient noises during driving as compared to the case where the current switch is gate-driven. This in turn makes it possible to increase the switching accuracy.

A further advantage of this embodiment is that use of the complementary output circuit at the driver stage may reduce the requisite number of series-connected elements relative to the power supply of such driver stage. Thus, it becomes possible to attain low voltage operations thereby enabling a drive power consumption to decrease. For example, a MOS-LSI is capable of operating with a power supply voltage at 1V or more or less.

Other advantage of the embodiment include an ability to simplify the circuit configuration and to increase operation reliability.

Figure 25:
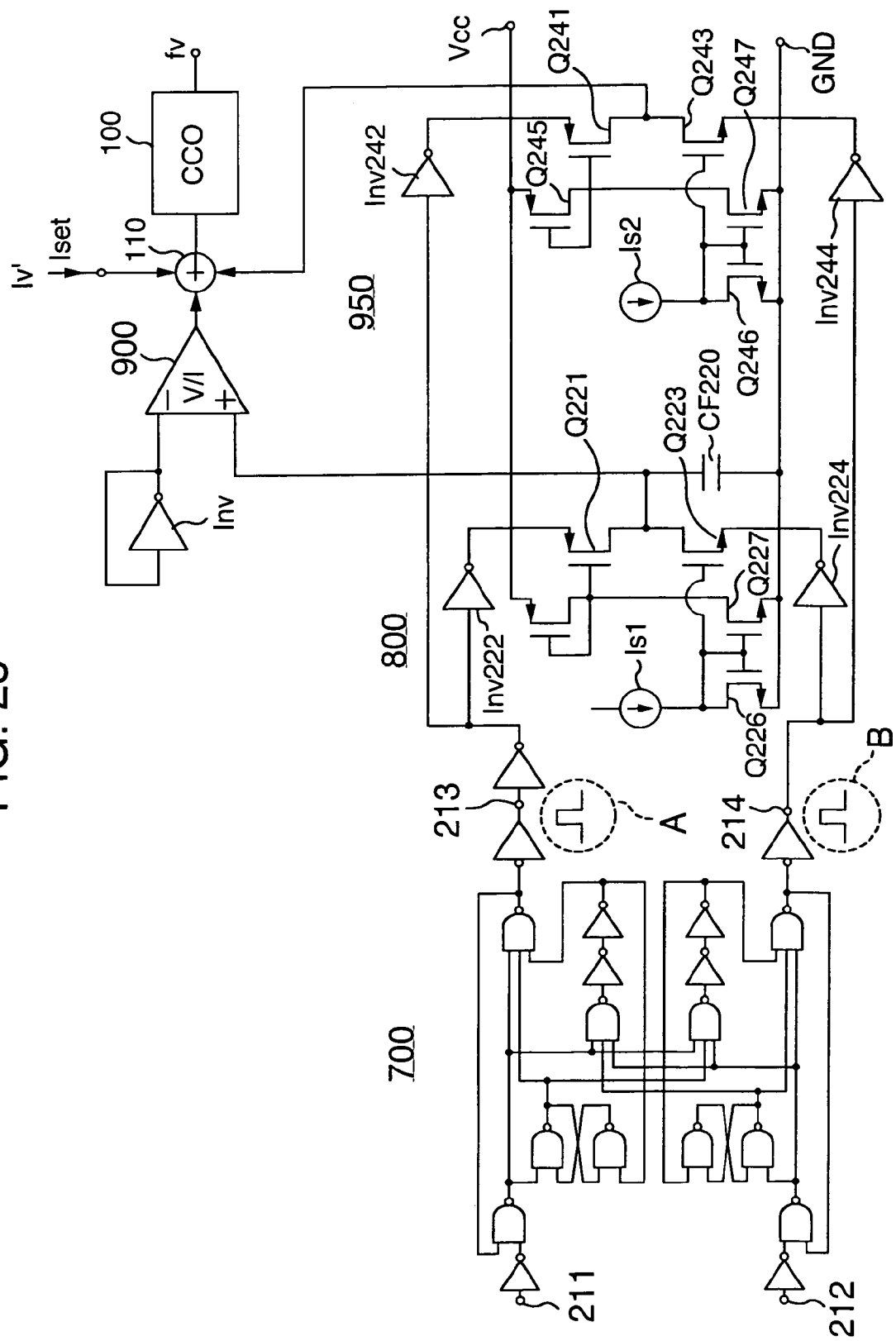
FIG. 25 is a diagram schematically showing a configuration of circuitry in case the current switch is applied to the broad band PLL circuit of the invention.

Next, there is shown in FIG. 25 a configuration resulted from applying the current switch to the broad band PLL circuit's charge pump circuit 800 and T/I converter 950. It is noted that the configuration shown in FIG. 25 is so designed that an output of the V/I converter 900 shown in FIG. 9 is input to the current adder 100. Also note that any adjustment signal being input to the T/I converter circuit via the coefficient circuit b2 960 shown in FIG. 9 is eliminated herein.

Upon outputting of a phase difference pulse signal of "UP" as indicated at part "A" of FIG. 25 to an output terminal 213 in a way corresponding to a phase difference between those signals as input to respective input terminals 211, 212 of a phase comparator circuit 700, an output of a CMOS inverter Inv222 of the charge pump circuit 800 is applied to the source of a MOS transistor Q221 in response to the above pulse signal. Whereby, the MOS transistor Q221 is rendered conductive within a limited time period corresponding to the pulse width (phase difference pulse width) of this pulse signal, thereby charging up a capacitor CF220. An incremental voltage component of the capacitor CF220 is input to the CCO 100 via V/I converter circuit 23 and current adder circuit 25. In responding to receipt of this, CCO 100 increases in oscillation frequency fv.

In addition, in response to the phase difference pulse signal of "UP" as output from the output terminal 213, an output of a CMOS inverter Inv242 of T/I converter circuit 950 is applied to the source of a MOS transistor Q241. This causes the MOS transistor Q241 to turn on within a limited time period corresponding to the phase difference pulse width, which results in a lead control signal being supplied to the lead control input of the current adder circuit 110, which signal is for permitting current addition or sum-up to stabilize the system involved.

On the other hand, upon outputting of a phase difference signal of "DOWN" as indicated at part B of FIG. 25 to the output terminal 214 in a way corresponding to a phase difference of the signals as input to the input terminals 211, 212 of the phase comparator circuit 700, an output of a CMOS inverter Inv224 of the charge pump circuit 800 is applied to the source of a MOS transistor Q223 in responding thereto. Whereby, the MOS transistor Q223 is rendered conductive in a limited time period corresponding to the phase difference pulse width causing the capacitor CF220 to discharge. A decremental voltage component of such capacitor CF220 is then input to the CCO 100 through the V/I converter circuit 900 and current adder circuit 100. In response to receipt of this, the CCO 100 lets the oscillation frequency fv decrease accordingly.

Additionally, in response to the phase difference pulse signal of "DOWN" as output from the output terminal 214, an output of a CMOS inverter Inv244 of the T/I converter circuit 950 is applied to the source of a MOS transistor Q243. This causes the MOS transistor Q243 to turn on in a limited time period corresponding to the phase difference pulse width, resulting in a lead control signal being fed to the lead control input of the current adder circuit 110, which signal is for permitting current draw-out to thereby stabilize the system concerned.

With the broad band PLL circuit as shown in FIG. 25 using the current switch circuit embodying the invention, the current switch offers high-speed operability while its current pulse output is excellent in charge/discharge symmetry, which leads to the achievability of narrow-pulse operations (e.g. 100 ps or less) without requiring any extra correction or compensation procedures. Thus, it becomes possible to attain enhanced PLL operability at ultrahigh frequencies on the order of from several hundreds of MHz up to a few GHz. In addition, since each current switch is simple in configuration while enabling achievement of operability with low voltages (e.g. 2V or below), it is possible to accomplish the intended broad band PLL circuit as required for clock generators of presently available advanced high-speed microprocessors even where the circuit is applied to standard PLL circuitry.

Note here that it would readily occur to those skilled in the art that the MOS transistors and MOS diodes plus CMOS inverters making up the broad band PLL circuit shown in FIG. 25 are manufacturable so that these are integrated together on a single LSI chip.

An explanation will next be given of a case where the current switch circuit in accordance with the first embodiment of the instant invention is applied to a digital-to-analog (D/A) converter circuit.

Figure 26:
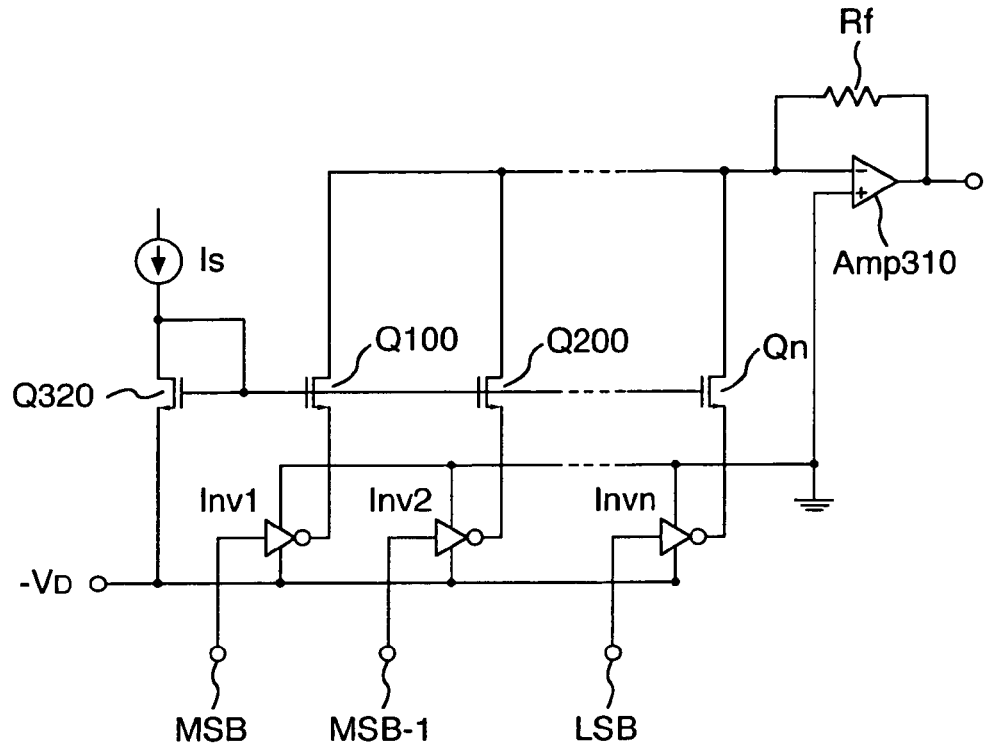
FIG. 26 is a diagram schematically showing a configuration of a D/A converter circuit of current addition type with the current switch circuit of the invention applied thereto.

FIG. 26 is a diagram schematically showing a configuration of a D/A converter circuit of the current addition type which employs the current switch circuit in accordance with the first embodiment of this invention.

The D/A converter circuit shown in FIG. 26 is arranged including a plurality of current switch circuits (MOS transistors Qx, CMOS inverters Invx, where $1 \leq x \leq n$, and n is the bit number of an input digital signal) that are applied binary weighting in a way corresponding respectively to the bits MSB-LSB of a digital signal being input thereto.

The MOS transistor Qx of each current switch circuit has its drain connected to an inverting (−) input terminal of an operational amplifier Amp310 having a feedback resistor Rf and a gate common-coupled and further a source connected to an output of its corresponding CMOS inverter Invx operatively associated therewith. Note that the gate of each MOS transistor Qx constitutes a current mirror circuit that is biased by a MOS diode Q320 for permitting flow of a reference current Is.

A corresponding bit of an input digital signal is input to the CMOS inverter Invx of each current switch circuit. The power supply voltages of each CMOS inverter Invx are GND and −VD. It is required that the value of VD be far greater than an operating voltage of the MOS diode Q320 for reference biasing. However, −VD may be bad in stability because a current bias circuit is used.

Next, an operation of the D/A converter circuit shown in FIG. 26 will be set forth below.

Suppose that the MSB of an input digital signal is at "H" level by way of example. If this is the case, an output of a CMOS inverter Inv1 of one current switch circuit corresponding to the MSB becomes −VD. Whereby, a current switch Q100 turns on causing a current IMSB pursuant to the MSB to flow out of the (−) input common line of the operational amplifier Amp310. Thus, an output voltage given by Rf·IMSB generates at the output terminal of the operational amplifier Amp310. Note here that although the bit input operation of the MSB of an input digital signal has been explained as one example, the same goes with an input operation of the other bits.

With the D/A converter circuit shown in FIG. 26, as the current switch circuit embodying the invention that is extremely high in operation speed is applied thereto, the settling required may be shortened— this advantage is obtainable in cooperation with the fact that the operational amplifier Amp31 derives an inverted output. It thus becomes possible to provide such high-speed D/A converter with relatively simplified configuration at low production costs.

Obviously the MOS transistors and MOS diodes plus CMOS inverters constituting the D/A converter circuit shown in FIG. 26 may be integrated together on a single LSI chip.

An explanation will next be given of a second embodiment of the present invention.

Figure 27:
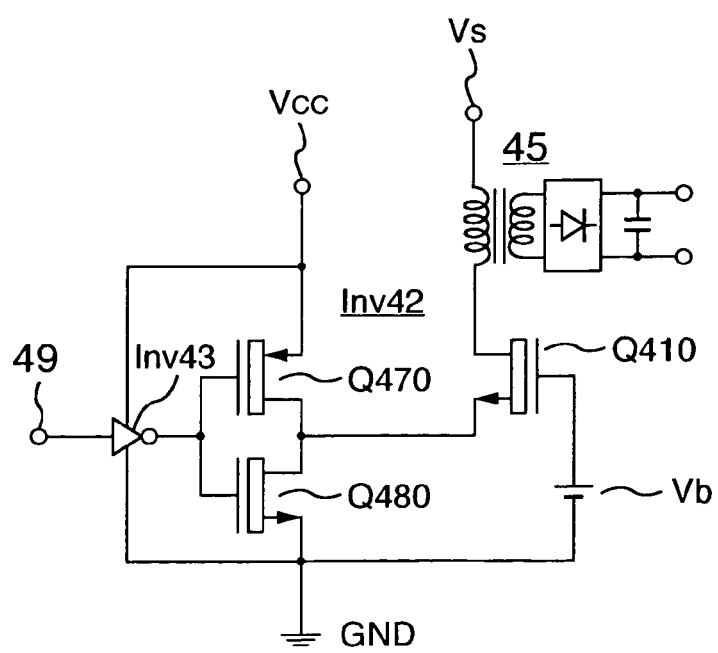
FIG. 27 is a diagram schematically showing a configuration of another current switch circuit of the invention.

FIG. 27 is a diagram depicting a schematical configuration of a current switch circuit in accordance with the second embodiment of the invention. The current switch circuit shown in FIG. 27 is a high-voltage power switching circuit that serves as basic circuitry such as switching power supply unit.

Here, Q410 designates a power MOS transistor (FET) that functions as a current switch; Inv42 denotes a complementary inverter serving as a voltage switch for driving the power MOS transistor Q410; Inv43 is a CMOS inverter for use in driving the inverter Inv42.

The power MOS transistor Q410 has a gate connected to a forward bias power supply Vb and a drain connected via a converter transformer 45 to a high-voltage power supply Vs (+120V, for example) while letting its source be coupled to an output of the complementary inverter Inv42.

The complementary inverter Inv42 is a complementary output circuit as configured from low-voltage power MOS transistors Q470 and Q480. The drains of such power MOS transistors Q470 and Q480 are coupled together at a common node, which serves as an output of the complementary inverter Inv42. The gates of power MOS transistors Q470 and Q480 are coupled together at a common node which is used as an input of the complementary inverter Inv42. The source of power MOS transistor Q470 is connected to the power supply voltage Vcc whereas the source of power MOS transistor Q480 is coupled to the ground GND.

The COMS inverter Inv43 is designed to receive the power supply voltage Vcc and ground GND as supplied thereto.

Examples of the capacities of respective power MOS transistors are as follows: Q410 is 200V/10A; Q470 and Q480 are 15V/10A for use in power supply synchronous rectification. Additionally the power supply voltage Vcc and bias voltage Vb being supplied to each inverter are carefully selected so that they satisfy the relation of VGon<Vb<Vcc, where VGon is the non-saturation operation gate voltage of the power MOS transistor Q410 acting acts as the current switch. One example is that VGon=4V, Vb=6V, and Vcc=8V.

In the current switch circuit thus arranged, upon application of a pulse signal of high frequency to an input terminal 49 of the CMOS inverter Inv43, a specific pulsate signal appears at an output of the complementary inverter Inv42, which signal has its amplitude equivalent to a potential difference between the power supply voltage Vcc and ground GND. In responding thereto, the power MOS transistor Q410 behaves to turn on when the output of the complementary inverter Inv42 is at a GND-side potential, and turn off when at a Vcc-side potential.

In this embodiment the power MOS transistor Q410 is not less in parasitic capacitance on the source side thereof. However, the output impedance of the complementary inverter Inv42 becomes equal to the turn-on resistance of the power MOS transistor Q480 during outputting of "L" and alternatively becomes the on-resistance of power MOS transistor Q470 when outputting of "H". And, in an event of an intermediate output, it becomes a parallel combination of the diode resistances of such power MOS transistor Q470 and Q480; hence, it is a low output impedance at any level.

Consequently, it is possible to rapidly discharge parasitic charge carriers of the power MOS transistor Q410 at any one of the output levels of the complementary inverter Inv42. Thus, the resultant operation of the current switch circuit becomes a virtually ideal drive while offering operability at high speeds.

An example is that under the voltage condition that Vs=+120V, VGon=4V, Vb=6V and Vcc=8V, it is possible to attain an operation at switching frequencies of 1 to 10MHz. This makes it possible to miniaturize or "downsize" the converter transformer 45 and smoothing capacitor(s). The current switch circuit of this embodiment is also adaptable for use in ultrasonic drivers or else.

It should be noted that in the current switch circuit of this embodiment, in case the forward bias as applied to the gate of the power MOS transistor Q410 acting as the current switch is a constant voltage, the complementary paired output voltage switch for driving this current switch circuit is capable of further modification or alteration in a wide variety of forms.

Figure 28:
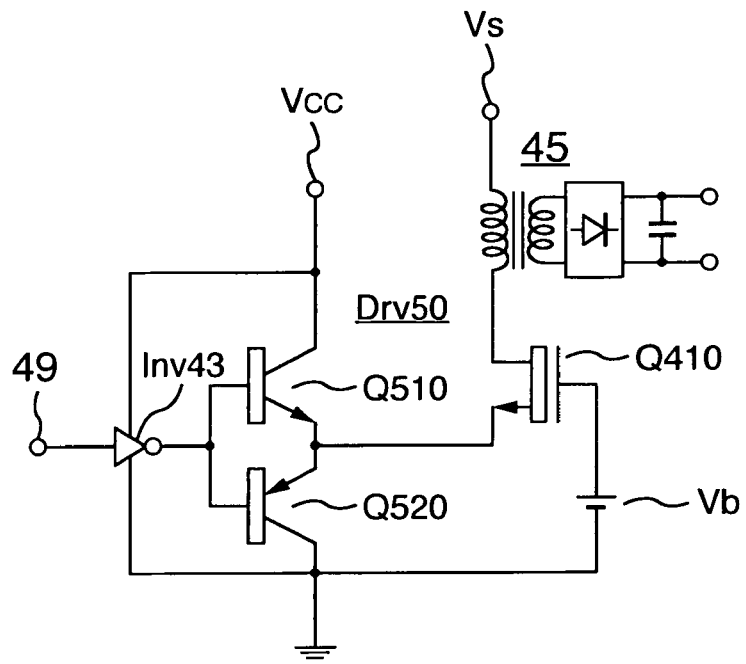
FIG. 28 is a diagram showing a modification of the second embodiment of the invention shown in FIG. 28.

FIG. 28 is a diagram showing one possible modification of the second embodiment of the present invention shown in FIG. 27.

The modified example shown in FIG. 28 is similar to the second embodiment of FIG. 27 with the complementary inverter Inv42 comprised of the low-voltage power MOS transistors Q470 and Q480 being replaced with a complementary emitter follower Drv50 that consists essentially of bipolar transistors Q510, Q520. Use of such complementary emitter follower Drv50 makes it possible to further reduce the output impedance as compared to the case of using the MOS inverter, thereby enabling improvement of the switching rate of the current switch.

Next, a third embodiment of the invention will be set forth below.

Figure 29:
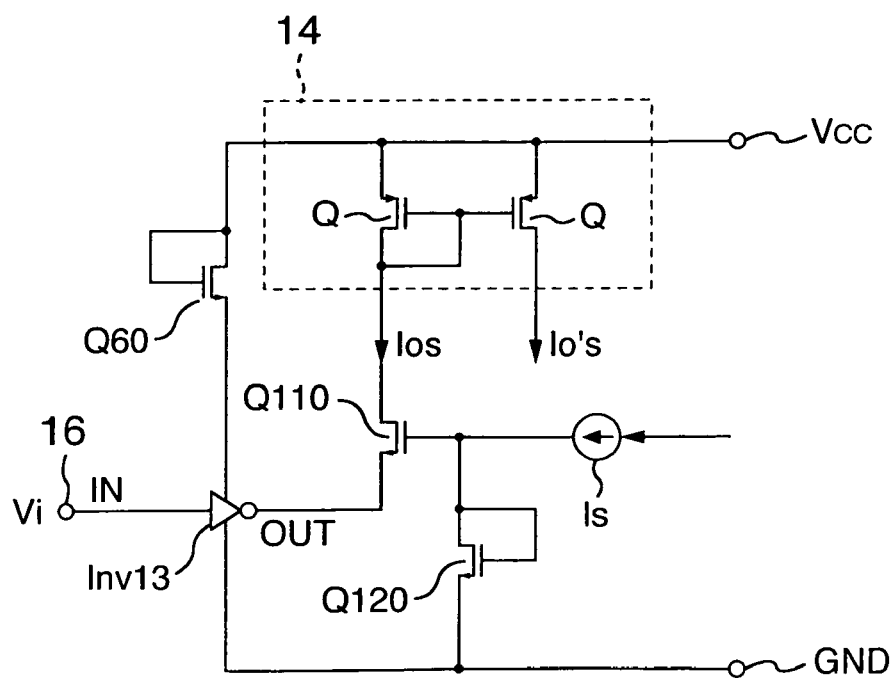
FIG. 29 is a diagram schematically showing a configuration of still another current switch circuit of the invention.

FIG. 29 is a diagram schematically showing a configuration of a current switch circuit in accordance with the third embodiment of the invention. Note that in FIG. 29, those parts or components having the same functions to those of the first embodiment shown in FIG. 23 are denoted by the same reference characters.

A difference of the current switch circuit of the third embodiment shown in FIG. 29 from the current switch circuit of the first embodiment shown in FIG. 23 is that a MOS diode Q60 for power supply voltage drop is inserted between the Vcc-side power supply electrode of the CMOS inverter Invl3 and the power supply Vcc. The remaining configuration is the same as that of the first embodiment shown in FIG. 23.

According to this embodiment, it is possible to suppress generation of drive noises by setting the cutoff level of an output of the CMOS inverter Invl3 at a minimal level required. If each MOS transistor constituting the current switch circuit decreases in threshold value while the conductance gm increases, then the requisite amplitude of a drive voltage may be minimized; accordingly, the above is effective for achievement of reduction of power dissipation and also noise reduction in circuitry. The remaining advantages are the same as those of the first embodiment stated supra.

It is noted that in this embodiment, the MOS diode Q60 for power supply voltage reduction can be replaced with other similar suitable voltage dropping means.

A fourth embodiment of the invention will next be explained below.

Figure 30:
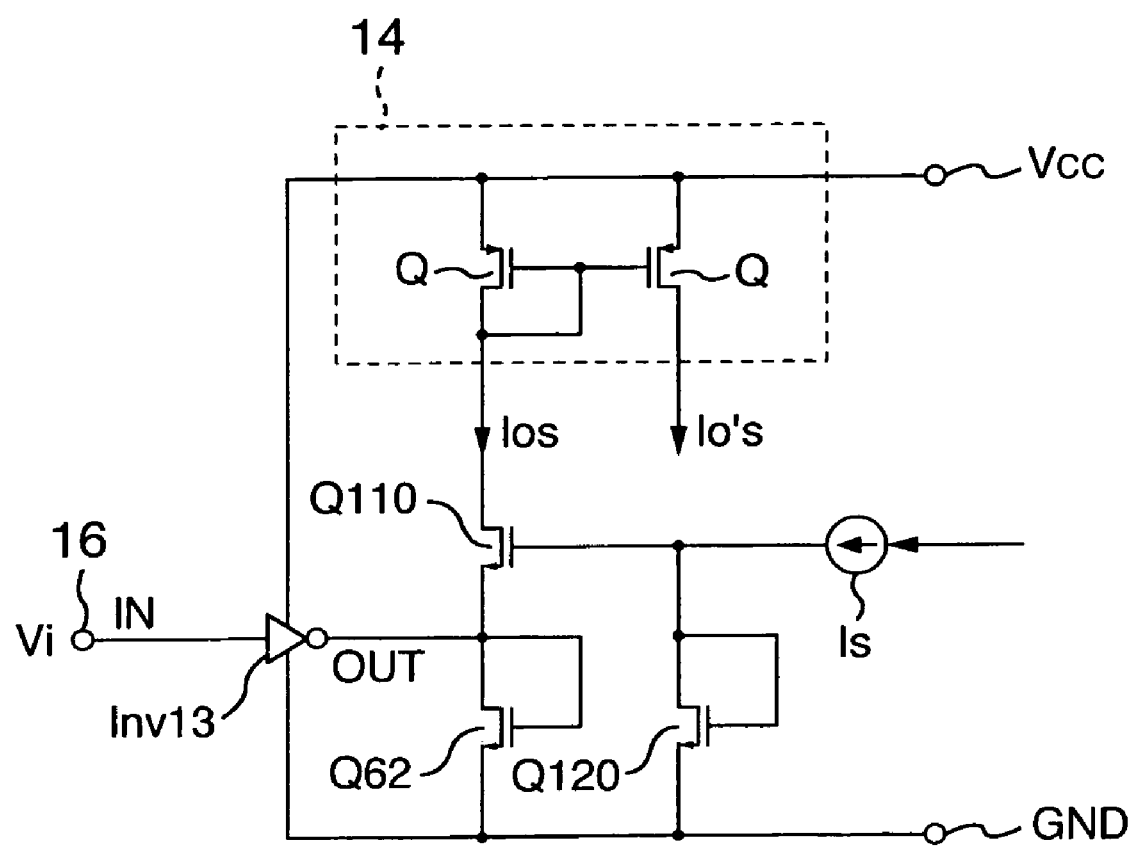
FIG. 30 is a diagram schematically showing a configuration of yet another current switch circuit of the invention.

FIG. 30 is a diagram schematically showing a configuration of a current switch circuit in accordance with the fourth embodiment of this invention. Note that in FIG. 30, those parts or components having the same functions to those of the first embodiment shown in FIG. 23 are denoted by the same reference characters.

A difference of the current switch circuit of the fourth embodiment shown in FIG. 30 from the current switch circuit of the first embodiment shown in FIG. 23 is that a MOS diode Q62 for limiting the maximum value of an output level is inserted between the output of the CMOS inverter Invl3 and the ground GND. The other configuration is the same as that of the first embodiment shown in FIG. 1.

With this embodiment also, as in the third embodiment of the invention stated previously, it is possible to set the cutoff level of the output of CMOS inverter Invl3 at a minimal level required while at the same time reducing occurrence of drive noises. The other effects are identical to those of the first embodiment.

It should be noted that although this embodiment is capable of setting up the cutoff level at any desired level through appropriate adjustment of the size of a PMOS transistor constituting the CMOS inverter Invl3 and the size of the MOS diode Q62, this advantage does not come without accompanying a penalty as to an increase in power consumption at MOS diode Q62.

Additionally this embodiment is modifiable so that the MOS diode Q62 is replaced with any other similar suitable amplitude adjuster means for adjustment of the cutoff level of the output of CMOS inverter Inv13.

Also note that although in a respective one of the embodiments stated above the current switch used therein is arranged to employ MOS transistors, the current switch used in the present invention should not be limited only to such MOS transistors. For instance, bipolar transistors may be used. In addition, the power current switch may also comprise more than one IGBT or other semiconductor switches.

Further note that although in each of the embodiments noted above the voltage switch is designed to make use of either the CMOS inverter or the complementary emitter follower consisting of two bipolar transistors, the voltage switch used in this invention may be freely modifiable into various forms as long as it is a complementary output circuit that has a low output impedance at both the high and low levels.

It has been described that the current switch circuit incorporating the principles of the invention is capable of shortening or minimizing the required switching time period with respect to both the turn-on and the turn-off operation. Additionally, low voltage operation is made possible.

What is claimed is:

1. A phase locked loop circuit comprising:
   a phase control unit, a frequency control unit and an oscillator;
   a first feedback circuit which feeds back an output of said oscillator to said oscillator through said phase control unit which operates for integral control; and
   a second feedback circuit which feeds back the output of said oscillator to said oscillator through said frequency control unit which operates for proportional control,
   wherein said first feedback circuit and said second feedback circuit are connected to said oscillator at all times so as to carry out the integral control and the proportional control continuously, and
   wherein said second feedback circuit includes a first converter circuit for conversion of said first clock signal into a first current, a second converter circuit for conversion of said second clock signal to a second current, and a current adder circuit for adding said first current and said second current together.

2. A phase locked loop circuit comprising:
   a phase control unit, a frequency control unit and an oscillator;
   a first feedback circuit which feeds back an output of said oscillator to said oscillator through said phase control unit which operates for integral control; and
   a second feedback circuit which feeds back the output of said oscillator to said oscillator through said frequency control unit which operates for proportional control,
   wherein said first feedback circuit and said second feedback circuit are connected to said oscillator at all times so as to carry out the integral control and the proportional control continuously, and
   wherein said second feedback circuit includes a first converter circuit for conversion of said first clock signal to a first voltage, a second converter circuit for conversion of said second clock signal to a second voltage, and a voltage adder circuit for adding said first voltage and said second voltage together.

3. A phase locked loop circuit comprising:
   a first control signal generator unit responsive to receipt of an input signal, for generating a first control signal for integral control of an output signal;
   a second control signal generator unit for generating based on the input signal a second control signal for proportional control of an output signal;
   an oscillator responsive to the first and second control signals for outputting a clock signal;
   a first feedback circuit for feeding back an output of said oscillator to said oscillator through said first control signal generator unit; and
   a second feedback circuit for feeding back the output of said oscillator to said oscillator through said second control signal generator unit,
   wherein said first feedback circuit and said second feedback circuit are connected to said oscillator at all times so as to operate continuously, and
   wherein said second control signal generator unit includes a first converter circuit for conversion of an input signal to a first current, a second converter circuit for conversion of an output signal to a second current, and a current adder circuit for adding together said first current and said second current.

4. The phase locked loop circuit as claimed in claim 3, wherein said first and second converter circuits include a charging/discharging circuit having a capacitor and a CMOS inverter for performing charging and discharging on the basis of a signal as input thereto, and a current mirror filter with a plurality of current mirror circuits folded for connection together.

5. A phase locked loop circuit comprising:
   a first control signal generator unit responsive to receipt of an input signal, for generating a first control signal for integral control of an output signal;
   a second control signal generator unit for generating based on the input signal a second control signal for proportional control of an output signal;
   an oscillator responsive to the first and second control signals for outputting a clock signal;
   a first feedback circuit for feeding back an output of said oscillator to said oscillator through said first control signal generator unit; and
   a second feedback circuit for feeding back the output of said oscillator to said oscillator through said second control signal generator unit,
   wherein said first feedback circuit and said second feedback circuit are connected to said oscillator at all times so as to operate continuously, and
   wherein said second control signal generator unit includes a first converter circuit for conversion of an input signal to a first voltage, a second converter circuit for conversion of an output signal to a second voltage, and a voltage adder circuit for adding together said first voltage and said second voltage.

6. The phase locked loop circuit as claimed in claim 5, wherein said first and second converter circuits include a charging/discharging circuit having a capacitor and a CMOS inverter for performing charging and discharging on the basis of a signal as input thereto, and a current mirror filter with a plurality of current mirror circuits connected together in a folded fashion.

7. The phase locked loop circuit as claimed in claim 5, wherein said first control signal generator unit uses a difference in phase between said input signal and said output signal to generate said first control signal, whereas said second control signal generator unit uses a difference in frequency between said input signal and said output signal to generate said second control signal.

8. A phase locked loop circuit comprising:
   a phase comparator circuit for outputting a phase difference signal from anyone of two output terminals in accordance with a phase difference between two signals as input thereto;
   a charge pump circuit responsive to receipt of the phase difference signal from said phase comparator circuit for permitting charging and discharging of a capacitor to generate a control voltage signal; and
   an oscillator responsive to the control voltage signal from said charge pump circuit for adjusting a transmission frequency, wherein said charge pump circuit includes a first current switch circuit for charging up said capacitor in deference to the phase difference signal as output from one output terminal of said phase comparator circuit, and a second current switch circuit for discharging said capacitor in response to the phase difference signal as output from a remaining one of the output terminals of said phase comparator circuit, and wherein said first and second current switch circuits comprise a current switch using a CMOS inverter with a control electrode forward-biased and a complementary paired output voltage switch for driving said current switch with an output connected to a low voltage-side electrode of said current switch.

9. A phase locked loop circuit comprising:
a first feedback circuit operatively responsive to receipt of a first clock signal, for generating a second clock signal synchronized in phase with the first clock signal; and
a second feedback circuit for generation of said second clock signal substantially equal in frequency to said first clock signal as input thereto, said second feedback circuit comprising:
  a first converter for conversion of said first clock signal into a first current;
  a second converter for conversion of said second clock signal to a second current; and
  an adder for adding said first current and said second current together.

10. A phase locked loop circuit comprising:
a first feedback circuit operatively responsive to receipt of a first clock signal, for generating a second clock signal synchronized in phase with the first clock signal; and
a second feedback circuit for generation of said second clock signal substantially equal in frequency to said first clock signal as input thereto, said second feedback circuit comprising:
  a first converter for conversion of said first clock signal into a first voltage;
  a second converter for conversion of said second clock signal to a second voltage; and
  an adder for adding said first voltage and said second voltage together.

11. A phase locked loop circuit comprising:
a first control signal generator unit responsive to receipt of an input signal, for generating a first control signal for integral control of an output signal;
a second control signal generator unit for generating, based on the input signal, a second control signal for proportional control of an output signal; and
an oscillator responsive to the first and second control signals, for outputting a clock signal;
wherein said first control signal generator unit includes a first converter circuit for conversion of an input signal to a first current, a second converter circuit for conversion of an output signal to a second current, and a current adder circuit for adding together said first current and said second current.

12. The phase locked loop circuit as claimed in claim 11, wherein said first and second converter circuits include a charging/discharging circuit having a capacitor and a CMOS inverter for performing charging and discharging on the basis of a signal as input thereto, and a current mirror filter with a plurality of current mirror circuits folded for connection together.

13. A phase locked loop circuit comprising:
a first control signal generator unit responsive to receipt of an input signal, for generating a first control signal for integral control of an output signal;
a second control signal generator unit for generating, based on the input signal, a second control signal for proportional control of an output signal; and
an oscillator responsive to the first and second control signals for outputting a clock signal;

wherein said first control signal generator unit uses a difference in phase between said input signal and said output signal to generate said first control signal, whereas said second control signal generator unit uses a difference in frequency between said input signal and said output signal to generate said second control signal; and
wherein said first control signal generator unit includes a first converter circuit for conversion of an input signal to a first current, a second converter circuit for conversion of an output signal to a second current, and a current adder circuit for adding together said first current and said second current.

14. The phase locked loop circuit as claimed in claim 13, wherein said first and second converter circuits include a charging/discharging circuit having a capacitor and a CMOS inverter for performing charging and discharging on the basis of a signal as input thereto, and a current mirror filter with a plurality of current mirror circuits folded for connection together.

15. A phase locked loop circuit comprising:
a first control signal generator unit responsive to receipt of an input signal, for generating a first control signal for integral control of an output signal;
a second control signal generator unit for generating, based on the input signal, a second control signal for proportional control of an output signal; and
an oscillator responsive to the first and second control signals, for outputting a clock signal;
wherein said first control signal generator unit includes a first converter circuit for conversion of an input signal to a first voltage, a second converter circuit for conversion of an output signal to a second voltage, and a voltage adder circuit for adding together said first voltage and said second voltage; and
wherein said first and second converter circuits include a charging/discharging circuit having a capacitor and a CMOS inverter for performing charging and discharging on the basis of a signal as input thereto, and a current mirror filter with a plurality of current mirror circuits connected together in a folded fashion.

16. The phase locked loop circuit as claimed in claim 3, wherein said first control signal generator unit uses a difference in phase between said input signal and said output signal to generate said first control signal, whereas said second control signal generator unit uses a difference in frequency between said input signal and said output signal to generate said second control signal.

17. An information processing apparatus comprising:
a clock generator unit;
a clock control unit for controlling the clock signal as output from said clock generator unit; and
a logic unit for processing data based on the clock signal as generated by said clock generator unit,
wherein said clock generator unit comprising:
a phase control unit, a frequency control unit and an oscillator;
a first feedback circuit which feeds back an output of said oscillator to said oscillator through said phase control unit which operates for integral control; and
a second feedback circuit which feeds back the output of said oscillator to said oscillator through said frequency control unit which operates for proportional control,
wherein said first feedback circuit and said second feedback circuit are connected to said oscillator at all times so as to carry out the integral control and the proportional control continuously, and said second feedback circuit includes a first converter circuit for conversion of said first clock signal into a first current, a second converter circuit for conversion of said second clock signal to a second current, and a current adder circuit for adding said first current and said second current together.

18. An information processing apparatus comprising:
a clock generator unit;
a clock control unit for controlling the clock signal as output from said clock generator unit; and
a logic unit for processing data based on the clock signal as generated by said clock generator unit,
wherein said clock generator unit comprising:
a phase control unit, a frequency control unit and an oscillator;
a first feedback circuit which feeds back an output of said oscillator to said oscillator through said phase control unit which operates for integral control; and
a second feedback circuit which feeds back the output of said oscillator to said oscillator through said frequency control unit which operates for proportional control,
wherein said first feedback circuit and said second feedback circuit are connected to said oscillator at all times so as to carry out the integral control and the proportional control continuously, and
said second feedback circuit includes a first converter circuit for conversion of said first clock signal to a first voltage, a second converter circuit for conversion of said second clock signal to a second voltage, and a voltage adder circuit for adding said first voltage and said second voltage.

19. An information processing apparatus comprising:
a clock generator unit;
a clock control unit for controlling the clock signal as output from said clock generator unit; and
a logic unit for processing data based on the clock signal as generated by said clock generator unit,
wherein said clock generator unit comprising:
a first control signal generator unit responsive to receipt of an input signal, for generating a first control signal for integral control of an output signal;
a second control signal generator unit for generating based on the input signal a second control signal for proportional control of an output signal:
an oscillator responsive to the first and second control signals for outputting a clock signal;
a feedback circuit for feeding back an output of said oscillator to said oscillator through said first control signal generator unit; and
a second feedback circuit for feeding back an output of said oscillator to said oscillator through said second control signal generator unit,
wherein said first feedback circuit and said second feedback circuit are connected to said oscillator at all times so as to operate continuously, and
said second control signal generator unit includes a first converter circuit for conversion of an input signal to a first current, a second converter circuit for conversion of an output signal to a second current, and a current adder circuit for adding together said first current and said second current.

20. An information processing apparatus comprising:
a clock generator unit;
a clock control unit for controlling the clock signal as output from said clock generator unit; and
a logic unit for processing data based on the clock signal as generated by said clock generator unit,
wherein said clock generator unit comprising:
a first control signal generator unit responsive to receipt of an input signal, for generating a first control signal for integral control of an output signal;
a second control signal generator unit for generating, based on the input signal, a second control signal for proportional control of an output signal;
an oscillator responsive to the first and second control signals for outputting a clock signal;
a first feedback circuit for feeding back an output of said oscillator to said oscillator through said first control signal generator unit; and
a second feedback circuit for feeding back an output of said oscillator to said oscillator through said second control signal generator unit,
wherein said first feedback circuit and said second feedback circuit are connected to said oscillator at all times so as to operate continuously, and
said second control signal generator unit includes a first converter circuit for conversion of an input signal to a first voltage, a second converter circuit for conversion of an output signal to a second voltage, and a voltage adder circuit for adding together said first voltage and said second voltage.

* * * * *